United States Patent
Hashimoto

(10) Patent No.: US 7,322,787 B2
(45) Date of Patent: Jan. 29, 2008

(54) DEVICES AND METHODS FOR REVERSING, TRANSPORTING, AND PROCESSING SUBSTRATES

(75) Inventor: Koji Hashimoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/129,012

(22) Filed: May 13, 2005

(65) Prior Publication Data

US 2006/0045722 A1    Mar. 2, 2006

(30) Foreign Application Priority Data

Jun. 22, 2004   (JP)   .............................. 2004-183399

(51) Int. Cl.
*B65G 47/248* (2006.01)
(52) U.S. Cl. ..................... 414/754; 414/936
(58) Field of Classification Search ............... 414/754, 414/758, 761–767, 771, 774–775, 777, 744.5, 414/776, 783, 936, 941; 901/31; 294/119.1; 118/731; 156/345.55
See application file for complete search history.

(56) References Cited

U.S. PATENT DOCUMENTS

| | | | | |
|---|---|---|---|---|
| 2,520,252 A | * | 8/1950 | Mutchler ..................... 414/622 |
| 2,862,629 A | * | 12/1958 | Aberle ........................ 414/771 |
| 4,533,291 A | * | 8/1985 | Nishida ....................... 414/728 |
| 5,474,641 A | * | 12/1995 | Otsuki et al. ................ 438/694 |
| 5,566,466 A | * | 10/1996 | Hearne ........................... 34/58 |
| 5,618,227 A | * | 4/1997 | Tsutsumi et al. ............ 451/288 |
| 5,775,000 A | * | 7/1998 | Maekawa et al. .............. 34/58 |
| 5,851,041 A | * | 12/1998 | Anderson et al. ........... 294/106 |
| 6,013,894 A | * | 1/2000 | Cheng et al. .......... 219/121.69 |
| 6,109,677 A | * | 8/2000 | Anthony .................... 294/103.1 |
| 6,361,422 B1 | * | 3/2002 | Ettinger et al. .............. 451/339 |
| 6,413,037 B1 | * | 7/2002 | Brodine ....................... 294/64.1 |
| 6,454,516 B1 | * | 9/2002 | Yamagishi ................... 414/754 |
| 6,593,045 B2 | * | 7/2003 | Sato et al. ...................... 430/30 |
| 6,817,823 B2 | * | 11/2004 | Fix et al. ...................... 414/217 |
| 6,886,231 B2 | * | 5/2005 | Lawson et al. ........... 29/407.01 |
| 6,918,735 B2 | * | 7/2005 | Urban et al. ................. 414/729 |
| 2003/0029479 A1 | | 2/2003 | Asano | |

FOREIGN PATENT DOCUMENTS

| | | | | |
|---|---|---|---|---|
| JP | 60228345 A | * | 11/1985 |
| JP | 05055342 A | * | 3/1993 |
| JP | 07130693 A | * | 5/1995 |
| JP | 09321005 A | * | 12/1997 |
| JP | 10264071 A | * | 10/1998 |
| JP | 11347779 A | * | 12/1999 |
| JP | 2000068352 A | * | 3/2000 |
| JP | 2003-59885 | | 2/2003 |
| JP | 2005093745 A | * | 4/2005 |

\* cited by examiner

*Primary Examiner*—Saul Rodriguez
*Assistant Examiner*—Charles Greenhut
(74) *Attorney, Agent, or Firm*—Ostrolenk, Faber, Gerb & Soffen, LLP

(57) ABSTRACT

A substrate is supported on a plurality of substrate supporting pins mounted to a second movable member. Next, so as to bring the plurality of substrate supporting pins close to a plurality of substrate supporting pins mounted to a first movable member, the first movable member and second movable member are moved, respectively. After this, with the substrate being supported between the substrate supporting pins, the first movable member and the second movable member are reversed. Then, the first movable member and the second movable member are moved relative to each other such that the respective plurality of substrate supporting pins are spaced apart from one another.

15 Claims, 14 Drawing Sheets

F I G. 2
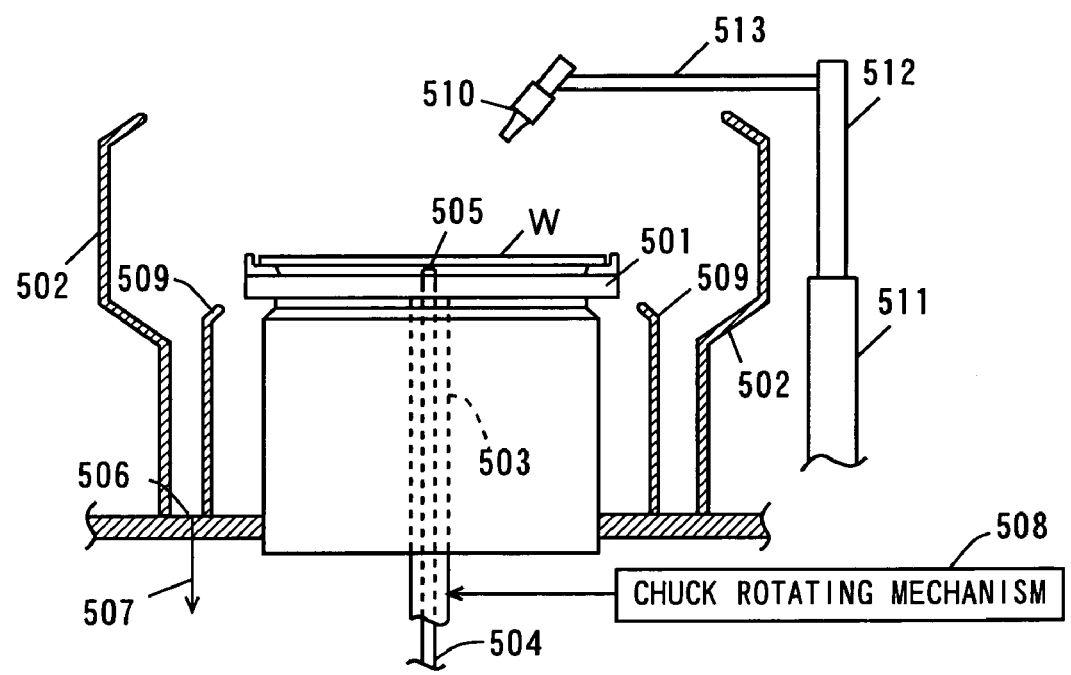

FIG. 10
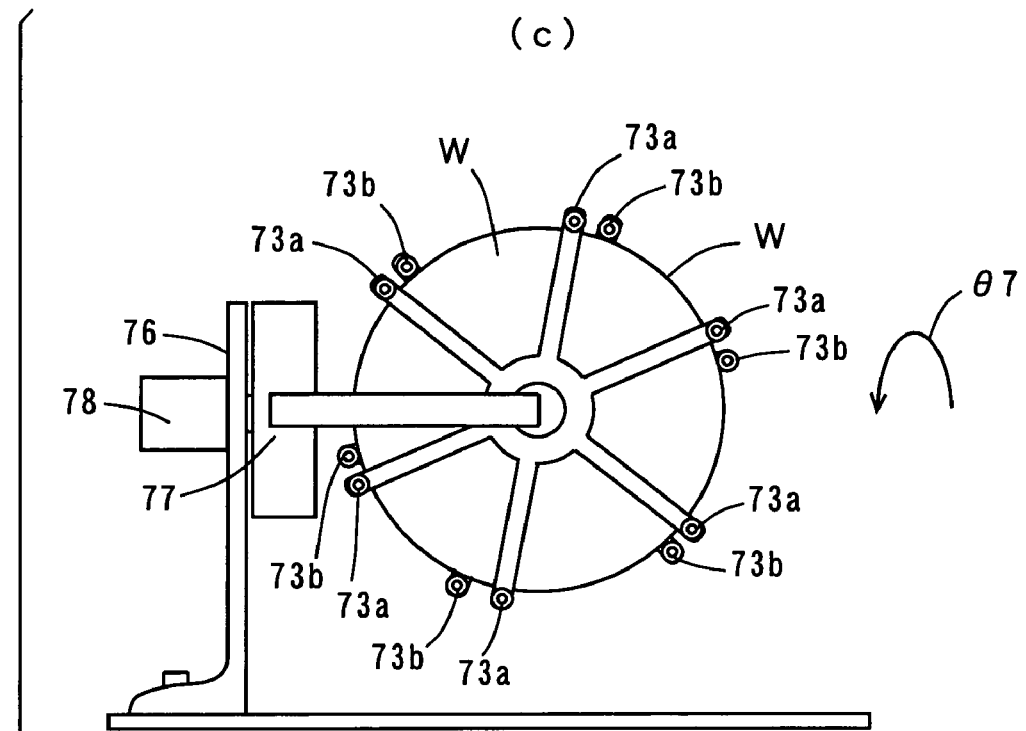
(c)
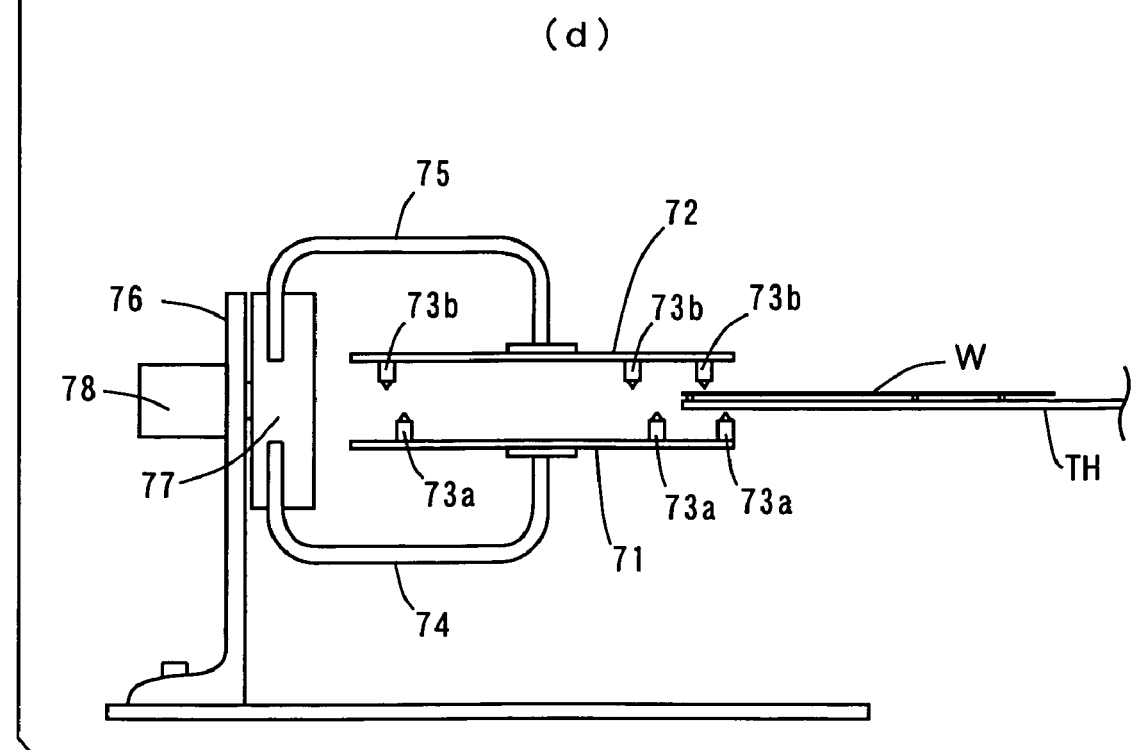
(d)

F I G. 1 1
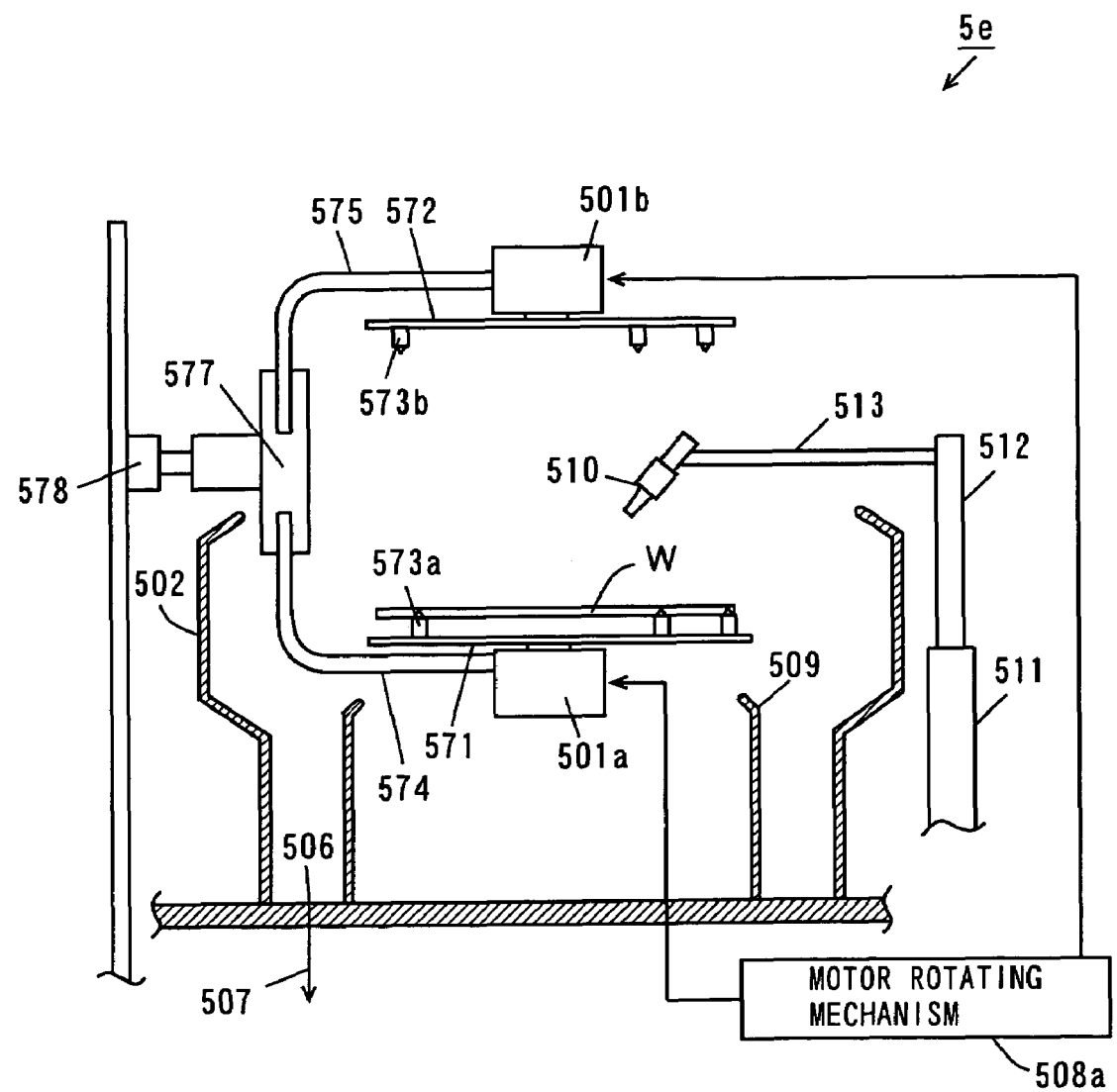

DEVICES AND METHODS FOR REVERSING, TRANSPORTING, AND PROCESSING SUBSTRATES

BACKGROUND OF THE INVENTION

1. Field of the Invention

The present invention relates to a substrate reversing device and substrate reversing method for reversing a substrate, relates to a substrate transporting device and substrate transporting method for transporting a substrate, and relates to a substrate processing device and substrate processing method for applying given processes to a substrate.

2. Description of the Background Art

The manufacturing process of a semiconductor device, liquid crystal display or the like involves a variety of processes applied to a substrate such as a semiconductor wafer, glass substrate or the like. The variety of processes include cleaning, resist coating, exposure, development, etching, ion implantation, resist removal, formation of interlayer insulating films, thermal treatment, and the like.

In the cleaning process, contaminants such as particles attached on the substrate are removed. As patterns have recently become finer, the cleaning process has attracted attention as a particularly important process.

For example, in transporting the substrate to each processing unit for the variety of processes, a transporting robot supports the edge and back surface of the substrate by the hand to transport the substrate. During this transport, particles attached on the hand of the transporting robot can sometimes settle on the back surface of the substrate. During the above-mentioned variety of processes, the particles attached on the back surface of the substrate may move onto the top surface of the substrate (pattern formation surface) to adversely affect the formation of a pattern on the substrate. For this reason, not only the top surface but also the back surface of the substrate must be cleaned.

In general, a cleaning device that performs the cleaning process of a substrate is capable of cleaning only one surface of a substrate at a time. Therefore, a substrate reversing device that reverses a substrate is employed (refer to JP 2003-59885 A).

FIG. 13 is a schematic diagram showing the appearance of a conventional substrate reversing device.

As shown in FIG. 13, the conventional substrate reversing device 900 has a substrate supporting member 950 that is moved upward and downward by means of a lifting device (not shown). The substrate supporting member 950 is mounted with a plurality of substrate supporting pins 960 for supporting the back and edge surfaces of a substrate W.

In addition, a pair of chucks 970 for seizing the ends of the substrate W being supported on the plurality of substrate supporting pins 960 are arranged above the substrate supporting member 950. The pair of chucks 970 are supported by a reversing mechanism 980 that rotates about the horizontal axis.

Next, operations of the substrate reversing device 900 of FIG. 13 will be described. FIG. 14 through FIG. 16 are schematic diagrams showing operations of the substrate reversing device 900 of FIG. 13. FIGS. 14(a1), 14(a2), 14(a3), FIGS. 15(a4), 15(a5), 15(a6), and FIGS. 16(a7), 16(a8) are each schematic side views showing the substrate reversing device 900. FIGS. 14(b1), 14(b2), 14(b3), FIGS. 15(b4), 15(b5), 15(b6), and FIGS. 16(b7), 16(b8) are each schematic plan views showing the substrate reversing device 900.

(1) Step of Placing a Substrate

As shown in FIG. 14(a1), the substrate W is first carried onto the substrate supporting member 950. In this case, as shown in FIG. 14(b1), the pair of chucks 970 are open.

(2) Step of Moving the Substrate Supporting Member Upward

Next, as shown in FIG. 14(a2), the substrate supporting member 950 supporting the substrate W moves upward in the direction of an arrow y, and stops in a position that the pair of chucks 970 can seize the both ends of the substrate W. In this case, as shown in FIG. 14(b2), the pair of chucks 970 are open.

(3) Step of Supporting the Substrate

After this, as shown in FIG. 14(b3), the pair of chucks 970 seize the ends of the substrate W. Thus, the substrate W is transferred to the pair of chucks 970 from the substrate supporting member 950.

(4) Step of Moving the Substrate Supporting Member Downward

Next, as shown in FIG. 15(a4), the substrate supporting member 950 moves down in the direction of an arrow −y to a position that the substrate supporting member 950 does not interfere with the pair of rotating chucks 970.

(5) Step of Reversing the Substrate

Then, as shown in FIGS. 15(a5) and 15(b5), the reversing mechanism 980 rotates 180 degrees the pair of chucks 970.

(6) Step of Moving the Substrate Supporting Member Upward

Then, as shown in FIGS. 15(a6), 15(b6), the substrate supporting member 950 moves upward in the direction of the arrow y, and stops in a position that the substrate supporting pins 960 can support the substrate W being supported on the pair of chucks 970.

(7) Step of Releasing the Substrate

After that, as shown in FIG. 16(b7), the pair of chucks 970 release the ends of the substrate W that have been seized. Thus, the substrate W that has been supported on the pair of chucks 970 is transferred onto the substrate supporting member 950, as shown in FIG. 16(a7).

(8) Step of Carrying the Substrate Out

Finally, as shown in FIGS. 16(a8), 16(b8), the substrate supporting member 950 supporting the substrate W moves downward in the direction of the arrow −y. Then, the substrate W is carried out of the substrate supporting member 950.

As described above, the process of reversing the substrate W using the conventional substrate reversing device 900 completes in eight steps.

However, the number of steps in reversing the substrate W using the conventional substrate processing device 900 is large, thus requiring a long time.

Moreover, prior to the step of rotating the substrate W, the substrate supporting member 950 have to be moved downward to such a position as to avoid the interference with the pair of chucks 970 and substrate W. This increases the size of the substrate reversing device 900.

In addition, three of the drive systems are necessary, i.e., the lifting device (not shown) for moving the substrate supporting member 950 upward and downward; reversing mechanism 980; and a substrate seizing mechanism (not shown) for the pair of chucks 970. This results in an increased parts count and increased number of exchanges of consumable items, leading to a high cost.

SUMMARY OF THE INVENTION

An object of the present invention is to provide a substrate reversing device capable of reversing a substrate reliably with a small number of steps and simple structure while enabling a smaller size.

Another object of the present invention is to provide a method capable of reversing a substrate reliably with a small number of steps, whereby the structure of a substrate reversing device can be made simpler and smaller.

Still another object of the present invention is to provide a substrate transporting device capable of transporting a substrate while performing the process of reversing the substrate in a short time, using a simple structure without upsizing a substrate reversing device.

Still another object of the present invention is to provide a method capable of transporting a substrate while performing the process of reversing the substrate in a short time, whereby the structure of a substrate reversing device can be made simpler and smaller.

Still another object of the present invention is to provide a substrate processing device capable of performing processing of a substrate while performing the process of reversing the substrate in a short time, using a simple structure without upsizing a substrate reversing device.

Still another object of the present invention is to provide a method capable of processing a substrate while performing the process of reversing the substrate in a short time, whereby the structure of the substrate reversing device can be made simpler and smaller.

(1) According to one aspect of the present invention, there is provided a substrate reversing device that reverses a substrate, comprising: first and second movable members arranged opposite to each other; a plurality of first supporters that are provided to the first movable member and support a peripheral portion of the substrate; a plurality of second supporters that are provided to the second movable member and support the peripheral portion of the substrate; a driving device that moves at least one of the first and the second movable members relative to the other such that the plurality of first supporters and the plurality of second supporters are selectively transferred between a first state in which the plurality of first supporters and the plurality of second supporters are spaced apart from one another and a second state in which the plurality of first supporters and the plurality of second supporters are close to one another; and a reversing device that reverses the first and the second movable members in the second state.

In the substrate reversing device, the substrate is supported substantially in the horizontal direction on the plurality of first supporters provided to the first movable member in the first state in which, for example, the plurality of second supporters are spaced above the plurality of first supporters. Next, at least one of the first and the second movable members are moved relative to the other such that the plurality of second supporters provided to the second movable member lying above the first movable member and the plurality of first supporters are brought close to one another. After this, with the substrate being present between the first supporters and the second supporters, the first and the second movable members are reversed such that the substrate is reversed, and simultaneously, the substrate that has been supported on the first supporters is supported on the second supporters. Then, at least one of the first and the second movable members is moved relative to the other such that the plurality of first supporters and the plurality of second supporters are spaced away from one another.

In this manner, the step of supporting the substrate and the step of reversing the substrate can be performed by means of the first and the second movable members. This decreases the number of steps for reversing the substrate while allowing the process of reversing the substrate to be performed in a short time.

Moreover, the substrate is supported and reversed by the first and the second movable members, so that a withdrawal space is unnecessary. This results in a smaller size of the substrate reversing device. In addition, the substrate can be reversed by means of the two driving systems, i.e., driving device and reversing device, resulting in a smaller parts count and smaller number of exchanges of consumable items. Consequently, the cost can be reduced.

Thus, the substrate reversing device is capable of reversing a substrate reliably with a small number of steps and simple structure while enabling a smaller size.

(2) In the second state, each of the first supporters and each of the second supporters may be arranged in positions shifted away from each other in a direction along the periphery of the substrate.

In this case, in the second state in which the first and the second movable members are close to each other, each of the first supporters and each of the second supporters do not interfere with each other, however close they may be. This prevents the substrate from dropping while being reversed, so that the substrate can be supported reliably.

(3) The first movable member may be composed of a plurality of first bar-shaped members that extend radially, each of the first supporters being provided on an end portion of each of the plurality of first bar-shaped members, and the second movable member may be composed of a plurality of second bar-shaped members that extend radially, each of the second supporters being provided on an end portion of each of the plurality of second bar-shaped members.

In this case, each of the first supporters is provided on the end portion of each of the plurality of first bar-shaped members extending radially in the first movable member, resulting in the weight reduction of the first movable member itself. Similarly, each of the second supporters is provided on the end portion of each of the plurality of second bar-shaped members extending radially in the second movable member, resulting in the weight reduction of the second movable member itself. Consequently, the load on the driving device can be reduced.

(4) Each of the first supporters and second supporters may have a supporting surface that supports the peripheral portion of the substrate and a restricting surface that prevents the substrate from slipping in a direction along a surface of the substrate.

In this case, the supporting surfaces of the first and second supporters can support the peripheral portion of the substrate, while the restricting surfaces of the first and second supporters can prevent the substrate from slipping in the direction along the surface of the substrate. Consequently, the substrate can be supported reliably.

(5) The supporting surface may be a convex surface, and the restricting surface may be an inclined surface that inclines away from the center of the substrate with increasing distance from a plane including the substrate being supported on the supporting surface.

In this case, since the supporting surfaces are convex surfaces, the peripheral portion of the substrate can be supported at the points. This allows for a less chance of particles settling on the substrate. Furthermore, the restricting surfaces, each having a side surface of the so-called tapered shape, enables the substrate to be directed to the supporting surfaces under its own weight, even if the substrate slips in the direction along the surface of the substrate.

(6) The reversing device may rotate 180 degrees the first and the second movable members. In this case, the reversing device is capable of rotating the substrate 180 degrees along with the first and the second movable members. This facilitates carrying the substrate into and out of the reversing device.

(7) The driving device may move both of the first and the second movable members such that the first and the second movable members are transferred between the first state and the second state.

In this case, both the first and second movable members move close to and apart from each other, so that the space in which the first movable member moves and the space in which the second movable member moves can be utilized as a space for reversing the substrate. In addition, both the first and second movable members move, so that the first and the second movable members can be transferred in a short time, either from the first to the second state or from the second to the first state.

(8) The first and the second movable members may be moved substantially an equal amount by the driving device. In this case, since both the first and second movable members move substantially an equal amount to be close to each other, the space in which the first and the second movable members move can be utilized most effectively as a space for reversing the substrate. In addition, both the first and second movable members move substantially an equal amount, so that the first and the second movable members can be transferred in the shortest time, either from the first to the second state or from the second to the first state.

(9) The substrate reversing device may further comprise a controller that controls the driving device such that in the second state, each of the plurality of first supporters and each of the plurality of second supporters partially overlap with each other in a direction vertical to the surface of the substrate. More specifically, when the first supporters and the second supporters approach one another, the controller may control the driving device to cause the first and the second movable members to move relative to each other, until the substrate is positioned in a space sandwiched between a plane including a tip portion of each first supporter and parallel to the substrate being supported on the first or second supporters and a plane including a tip portion of each second supporter and parallel to the substrate being supported on the first or second supporters.

In this case, each of the plurality of first supporters and each of the plurality of second supporters partially overlap with each other in the second state, so that the peripheral position of the substrate is supported on either the plurality of first supporters or plurality of second supporters. This prevents the substrate from dropping, particularly in its nearly vertical state.

(10) According to another aspect of the present invention, there is provided a substrate transporting device that transports a substrate, comprising: a substrate reversing device; and a moving device that moves the substrate reversing device, wherein the substrate reversing device includes: first and second movable members arranged opposite to each other; a plurality of first supporters that are provided to the first movable member and support a peripheral portion of the substrate; a plurality of second supporters that are provided to the second movable member and support the peripheral portion of the substrate; a driving device that moves at least one of the first and the second movable members relative to the other such that the plurality of first supporters and the plurality of second supporters are selectively transferred between a first state in which the plurality of first supporters and the plurality of second supporters are spaced apart from one another and a second state in which the plurality of first supporters and the plurality of second supporters are close to one another; and a reversing device that reverses the first and the second movable members in the second state.

The substrate transporting device is capable of transporting a substrate while reversing the substrate using the substrate reversing device with the above-described structure.

This allows the substrate to be transported and the process of reversing the substrate to be performed in a short time, using a simple structure without upsizing the substrate reversing device.

(11) According to still another aspect of the present invention, there is provided a substrate processing device that performs processing of a substrate, comprising: a substrate reversing device that reverses the substrate while supporting the substrate; and a processing device that performs processing of the substrate being supported by the substrate reversing device, wherein the substrate reversing device includes: first and second movable members arranged opposite to each other; a plurality of first supporters that are provided to the first movable member and support a peripheral portion of the substrate; a plurality of second supporters that are provided to the second movable member and support the peripheral portion of the substrate; a driving device that moves at least one of the first and the second movable members relative to the other such that the plurality of first supporters and the plurality of second supporters are selectively transferred between a first state in which the plurality of first supporters and the plurality of second supporters are spaced apart from one another and a second state in which the plurality of first supporters and the plurality of second supporters are close to one another; and a reversing device that reverses the first and the second movable members in the second state.

The substrate processing device is capable of performing processing of a substrate while reversing the substrate using the substrate reversing device with the above-described structure.

This allows the substrate to be processed and the process of reversing the substrate to be performed in a short time, using a simple structure without upsizing the substrate reversing device.

(12) The processing device may include first and second processing units that perform processing of the substrate, and the substrate reversing device may reverse the substrate subjected to processing by the first processing unit, and wherein the second processing unit may perform processing of the substrate reversed by the substrate reversing device.

The substrate processing device is capable of processing a substrate by the first processing unit, and reversing the substrate that has been subjected to processing by the substrate reversing device with the above-described structure, so as to process the substrate by the second processing unit.

This allows processing of a substrate to be performed and the process of reversing the substrate to be performed in a short time, using a simple structure without upsizing the substrate reversing device.

(13) According to still another aspect of the present invention, there is provided a method of reversing a substrate, comprising the steps of: supporting the substrate on a plurality of first supporters provided to a first movable member; subsequent to the step of supporting the substrate on the plurality of first supporters, moving at least one of the first movable member and a second movable member relative to the other such that a plurality of second supporters provided to the second movable member are brought close to the plurality of first supporters; subsequent to the step of moving, reversing the first and the second movable members while supporting the substrate on the plurality of second supporters that has been supported on the plurality of first supporters; and subsequent to the step of supporting the substrate on the plurality of second supporters, moving at least one of the first and the second movable members relative to the other such that the plurality of first supporters and the plurality of second supporters are spaced apart from one another.

In the substrate reversing method, a substrate is supported on the plurality of first supporters provided to the first movable member. Next, at least one of the first and the second movable members is moved relative to the other such that the plurality of second supporters provided to the second movable member approach the plurality of first supporters. Then, the first and the second movable members are reversed, and simultaneously, the substrate that has been supported on the plurality of first supporters are transferred onto the plurality of second supporters on which they are supported. After this, at least one of the first and the second movable members is moved relative to the other such that the plurality of first supporters and the plurality of second supporters are spaced apart from one another.

In this case, the steps of bringing the first and the second supporters close, reversing the first and the second movable members, and moving the first and the second supporters apart can be performed by means of the first and the second movable members. This allows the number of steps for reversing the substrate to decrease and the process of reversing the substrate to be performed in a short time.

Moreover, the substrate is supported and reversed by means of the first and the second movable members, so that a withdrawal space is unnecessary. In addition, the substrate can be reversed by means of the two driving systems, resulting in a smaller parts count and smaller number of exchanges of consumable items. Consequently, the cost can be reduced.

Thus, the substrate reversing method allows a substrate to be reversed reliably with a small number of steps and simple structure while enabling a smaller size of the substrate reversing device.

(14) According to still another aspect of the present invention, there is provided a transporting method for transporting a substrate, comprising the steps of: reversing the substrate while supporting the substrate using a substrate reversing device; and moving the substrate reversing device supporting the substrate, wherein the step of reversing the substrate while supporting the substrate comprises the steps of: supporting the substrate on a plurality of first supporters provided to a first movable member in the substrate reversing device; subsequent to the step of supporting the substrate on the plurality of first supporters, moving at least one of the first and the second movable members relative to the other such that a plurality of second supporters provided to a second movable member are brought close to the plurality of first supporters in the substrate reversing device; subsequent to the step of moving, reversing the first and the second movable members while supporting the substrate on the plurality of second supporters that has been supported on the plurality of first supporters; and subsequent to the step of supporting the substrate on the plurality of second supporters, moving at least one of the first and the second movable members relative to the other such that the plurality of first supporters and the plurality of second supporters are spaced apart from one another.

The substrate transporting method allows a substrate to be transported by moving the substrate reversing device while reversing the substrate using the substrate reversing device according to the above-described steps.

This allows the substrate to be transported and the process of reversing the substrate to be performed in a short time, using a simple structure without upsizing the substrate reversing device.

(15) According to still another aspect of the present invention, there is provided a method of processing a substrate for performing processing of the substrate, comprising the steps of: reversing the substrate while supporting the substrate using a substrate reversing device; and performing processing of the substrate being supported by the substrate reversing device, wherein the step of reversing the substrate while supporting the substrate comprises the steps of: supporting the substrate on a plurality of first supporters provided to a first movable member in the substrate reversing device; subsequent to the step of supporting the substrate on the plurality of first supporters, moving at least one of the first and the second movable members relative to the other such that a plurality of second supporters provided to a second movable member are brought close to the plurality of first supporters in the substrate reversing device; subsequent to the step of moving, reversing the first and the second movable members while supporting the substrate on the plurality of second supporters that has been supported on the plurality of first supporters; and subsequent to the step of supporting the substrate on the plurality of second supporters, moving at least one of the first and the second movable members relative to the other such that the plurality of first supporters and the plurality of second supporters are spaced apart from one another.

The substrate processing method allows processing of a substrate to be performed, while reversing the substrate using the substrate reversing device according to the above-described steps.

This allows processing of the substrate to be performed and the process of reversing the substrate to be performed in a short time, using a simple structure without upsizing the substrate reversing device.

(16) The step of performing processing of the substrate may include the step of performing first processing of the substrate and the step of performing second processing of the substrate, and the step of reversing the substrate while supporting the substrate may include the step of reversing the substrate that has been subjected to the first processing, using the substrate reversing device, and wherein the step of performing second processing may include the step of performing the second processing of the reversed substrate.

Thus, the substrate reversing device is capable of reversing a substrate reliably with a small number of steps and simple structure while enabling a smaller size.

In the substrate processing method, a substrate can be subjected to the first processing, and then reversed by the substrate reversing device to be subjected to the second processing.

This allows the substrate to be processed and the process of reversing the substrate to be performed in a short time, using a simple structure without upsizing the substrate reversing device.

The foregoing and other objects, features, aspects and advantages of the present invention will become more

BRIEF DESCRIPTION OF THE DRAWINGS

FIG. 2 is a schematic side view showing an example of each of the processing units of FIG. 1;

FIGS. 10(c) and 10(d) are schematic structural diagrams showing operations of the substrate reversing device according to the embodiment;

FIG. 11 is a schematic cross section showing a second embodiment in which the substrate reversing device is mounted in a processing unit;

DESCRIPTION OF THE PREFERRED EMBODIMENTS

Figure 1:
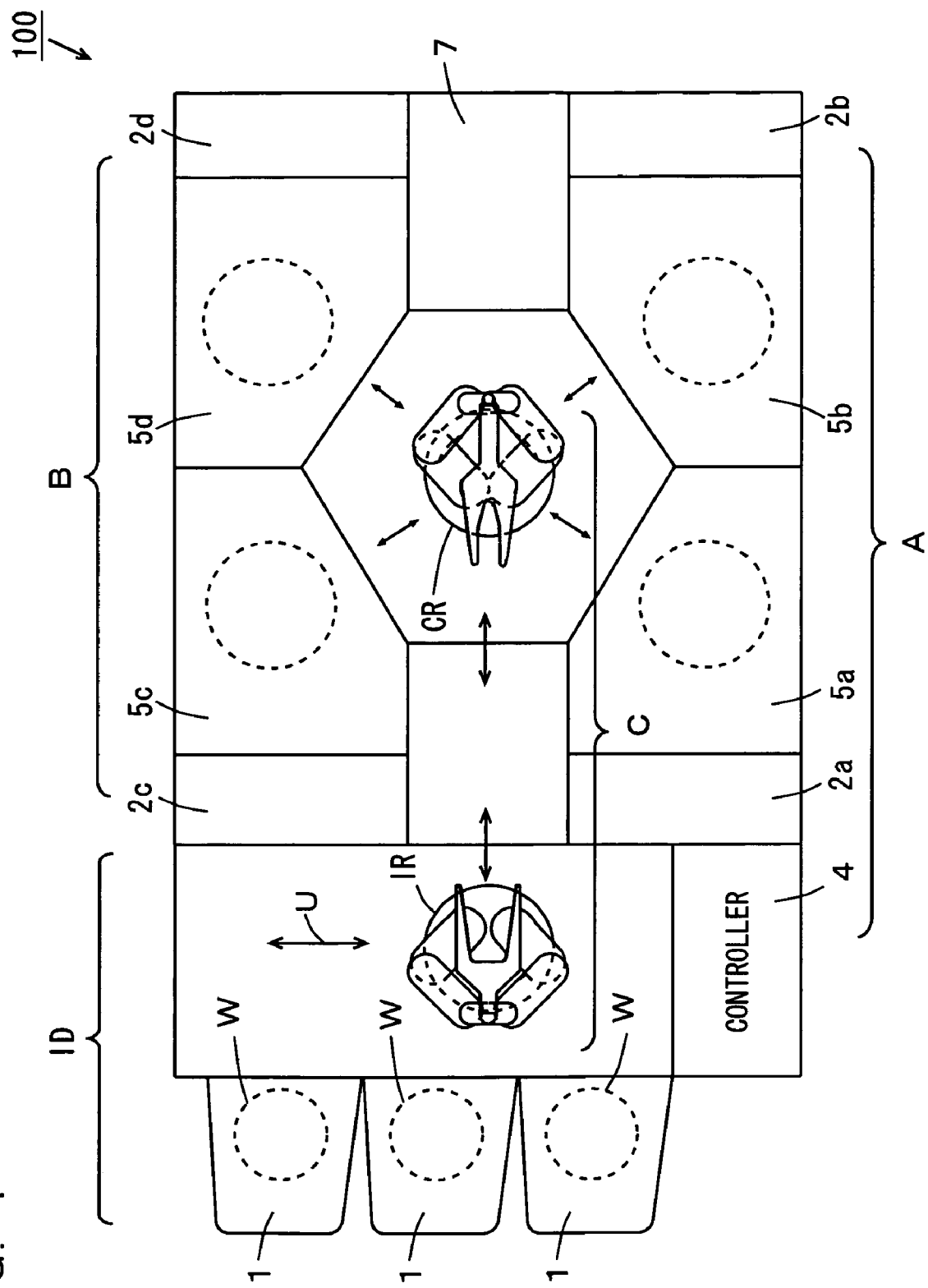
FIG. 1 is a plan view of a substrate processing device according to a first embodiment of the present invention.

Description will be made of a substrate processing device that includes a substrate reversing device according to an embodiment of the present invention, referring to the drawings.

In the specification, a substrate refers to a semiconductor wafer, glass substrate for a liquid crystal display, glass substrate for a PDP (plasma display panel), glass substrate for a photomask, substrate for an optical disk, or the like.

FIG. 1 is a plan view of a substrate processing device according to a first embodiment.

As shown in FIG. 1, the substrate processing device 100 has processing regions A, B, and a transporting region C between the processing regions A, B.

The processing region A includes a controller 4, fluid boxes 2a, 2b, and processing units 5a, 5b. The processing region B includes fluid boxes 2c, 2d and processing units 5c, 5d.

The fluid boxes 2a, 2b in FIG. 1, respectively, house fluid related equipment including piping, joints, valves, flow meters, regulators, pumps, temperature controllers, and processing solution storage tanks for supplying and discharging e.g., a chemical solution or water to and from the processing units 5a, 5b. The fluid boxes 2c, 2d, respectively, house fluid related equipment including piping, joints, valves, flow meters, regulators, pumps, temperature controllers, and processing solution storage tanks for supplying and discharging e.g., a chemical solution or water to and from the processing units 5c, 5d.

Each of the processing units 5a to 5d performs a cleaning process using a chemical solution (hereinafter referred to as chemical cleaning) and a cleaning process using water (hereinafter referred to as water cleaning). The water cleaning involves washing off a residual chemical solution from the substrate after the chemical cleaning. Then, a spin drying process is performed in which the substrate W is rotated to shake off the water on the substrate W. An ammonia ($NH_3$)-hydrogen peroxide ($H_2O_2$) solution (APM) or hydrogen peroxide solution, for example, may be used as the chemical solution.

The processing units 5a, 5b, 5c, 5d will collectively be referred to as processing units. The transporting region C includes a substrate transporting robot CR. Between the processing region A and processing region B, a substrate reversing device 7 is arranged for reversing a substrate W. The substrate reversing device 7 will be described in detail below.

An indexer ID for loading and unloading substrates is arranged on one end of the processing regions A, B. The indexer ID is mounted with carriers 1 for storing the substrates W.

In this embodiment, FOUPs (Front Opening Unified Pods) that store the substrates W in an enclosed state are used as the carriers 1; however, other carriers including, SMIF (Standard Mechanical Inter Face) pods or OCs (Open Cassettes) may also be used as the carriers 1.

The indexer robot IR in the indexer ID moves in the direction of an arrow U to take out a substrate W from any of the carriers 1, and transfers the substrate W to the substrate transporting robot CR. Conversely, the indexer robot IR receives the substrate W subjected to a series of processes from the substrate transporting robot CR, and returns it to the carrier 1.

The substrate transporting robot CR carries the substrate W transferred from the indexer robot IR to a specified processing unit. The substrate transporting robot CR also receives the substrate W from the specified processing unit, and carries it to another processing unit or the substrate reversing device 7 or indexer robot IR.

The controller 4 is composed of a computer or the like that includes a CPU (central processing unit). The controller 4 controls the operation of each of the processing units in the processing regions A, B; operation of the substrate reversing device 7; operation of the substrate transporting robot CR in the transporting region C; and operation of the indexer robot IR in the indexer ID.

The substrate processing device 100 of FIG. 1 is installed in a clean room of the downflow system, for example.

Now, description is made of an illustrative procedure of processing the substrate W which is performed by the substrate processing device 100 in the first embodiment, using the substrate reversing device 7 (referring to FIG. 1).

1) First, the indexer robot IR takes out a given substrate W of the plurality of substrates W stored in the carriers 1.

2) Next, the indexer robot IR transfers the substrate W to the substrate transporting robot CR.

3) Then, the substrate transporting robot CR carries the substrate W into the substrate reversing device 7.

4) Then, the substrate reversing device 7 reverses the substrate W such that a surface of the substrate W opposite to its device formation surface faces upward. The operation of reversing the substrate W by the substrate reversing device 7 will be described in detail below.

5) The substrate transporting robot CR subsequently carries the reversed substrate W from the substrate reversing device 7.

6) After this, the substrate transporting robot CR carries the substrate W into one of the processing units 5a to 5d, for example the processing unit 5a. At this moment, the substrate W is supported by a substrate supporting device in the processing unit 5a, for example by the spin chuck 501 in FIG. 2 shown below, such that the surface of the substrate W opposite to its device formation surface (hereinafter referred to as a non-device-formation surface) faces upward.

7) Then, in the processing unit 5a, while the substrate supporting device supporting the substrate W is being rotated, the substrate W is subjected to a series of processes including the above-mentioned chemical cleaning, water cleaning, and spin drying, with the non-device-formation surface of the substrate W facing upward.

8) Then, the substrate transporting robot CR carries the substrate W that has been subjected to the series of processes from the processing unit 5a.

9) The substrate transporting robot CR subsequently carries the substrate W to the substrate reversing device 7.

10) Then, the substrate reversing device 7 again reverses the substrate W, such that the device formation surface of the substrate W faces upward. That is, the substrate W returns to the same state as stored in the carrier 1.

11) Next, the substrate transporting robot CR carries the reversed substrate W from the substrate reversing device 7.

12) Then, the substrate transporting robot CR carries the substrate W into one of the other processing units 5b, to 5d, for example, the processing unit 5b. At this moment, the substrate W is supported by a substrate supporting device in the processing unit 5b, for example by the spin chuck 501 in FIG. 2 shown below, such that the device formation surface of the substrate W faces upward.

13) Then, in the processing unit 5b, while the substrate supporting device supporting the substrate W is being rotated, the substrate W is subjected to a series of processes including the above-mentioned chemical cleaning, water cleaning, and spin drying, with the device formation surface of the substrate W facing upward.

14) After this, the substrate transporting robot CR carries the substrate W that has been subjected to the series of processes from the processing unit 5b.

15) Finally, the substrate transporting robot CR transfers the substrate W to the indexer robot IR, and in turn, the indexer robot IR transfers and stores the substrate W into the carrier 1.

According to the above-mentioned processing procedure, the substrate W is first reversed by the substrate reversing device 7, and then subjected to the first processing in the processing unit 5a with its non-device-formation surface facing upward. After that, the substrate W is again reversed by the substrate reversing device 7, and then subjected to the second processing in the processing unit 5b, with its device formation surface facing upward.

In this manner, satisfactory processing can be applied to both surfaces of the substrate W (i.e., device formation surface and non-device-formation surface).

FIG. 2 is a schematic side view showing an example of each of the processing units in FIG. 1.

As shown in FIG. 2, each of the processing units 5a, 5b, 5c, and 5d includes a spin chuck 501 for horizontally supporting a substrate W and rotating the substrate W about a vertical rotating axis passing through the center of the substrate W. The spin chuck 501 is secured to the upper end of the rotating shaft 503 which is rotated via a chuck rotating mechanism 508. During the drying process after the process using a chemical solution or water, the substrate W is rotated while being horizontally supported by the spin chuck 501.

A motor 511 is arranged external to the spin chuck 501. The motor 511 is connected with a rotating shaft 512. The rotating shaft 512 is coupled to an arm 513 extending in the horizontal direction, of which end is mounted with a nozzle 510.

The rotating shaft 503 of the spin chuck 501 is composed of a hollow shaft. A processing solution supplying pipe 504 is inserted through the inside of the rotating shaft 503. The processing solution supplying pipe 504 is supplied with a processing solution for cleaning the lower surface of the substrate W. The processing solution supplying pipe 504 extends to a position close to the lower surface of the substrate W supported on the spin chuck 501. On one end of the processing solution supplying pipe 504 is a lower surface nozzle 505 that discharges the processing solution toward the center of the lower surface of the substrate W.

The spin chuck 501 is housed in a processing cup 502. A cylindrical partition wall 509 is arranged inside the processing cup 502. In addition, a solution recovery space 506 for recovering the chemical solution used in processing the substrate W is formed between the processing cup 502 and partition wall 509. The solution recovery space 506 is connected with a recovery pipe 507 for recycling the recovered chemical solution.

Either or both the nozzle 510 and lower surface nozzle 505 discharge the chemical solution or water. This provides for cleaning of the top surface (upper surface) and back surface (lower surface) of the substrate W. However, while the nozzle 510 facing the top surface of the substrate W and mounted to the swinging arm 513 is capable of thoroughly cleaning the overall surface of the substrate W, the nozzle 505, lying immovably on the back surface of the substrate W, has difficulty in removing contaminants strongly attached on the back surface of the substrate W, as compared to the top surface of the substrate W. Thus, it is preferable to reverse the substrate after cleaning its top surface using the substrate reversing device 7 described below, and also clean the back surface of the substrate.

The structure of the substrate reversing device 7 will be described next.

Figure 3:
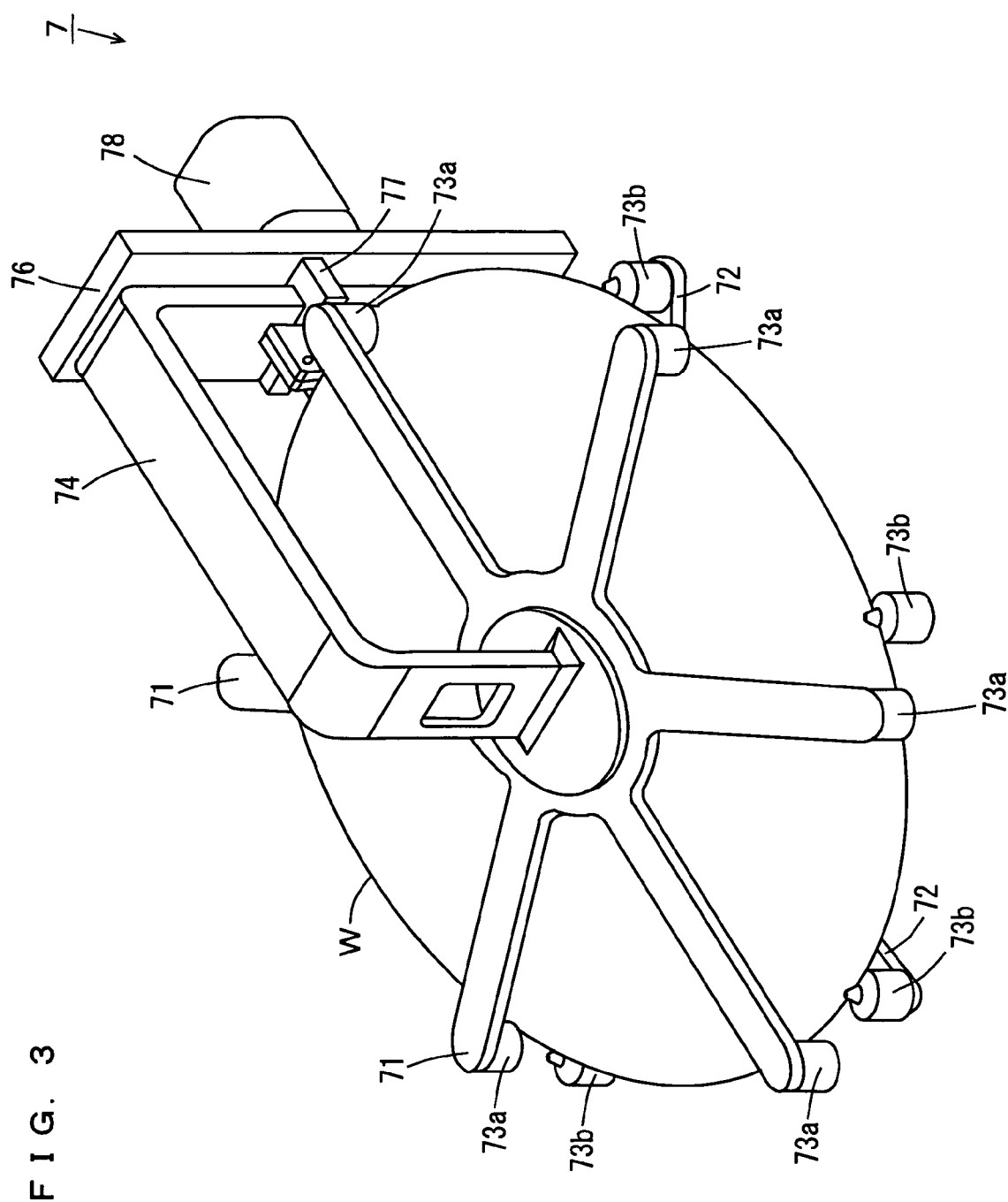
FIG. 3 is a perspective view showing the appearance of the substrate reversing device.
Figure 4:
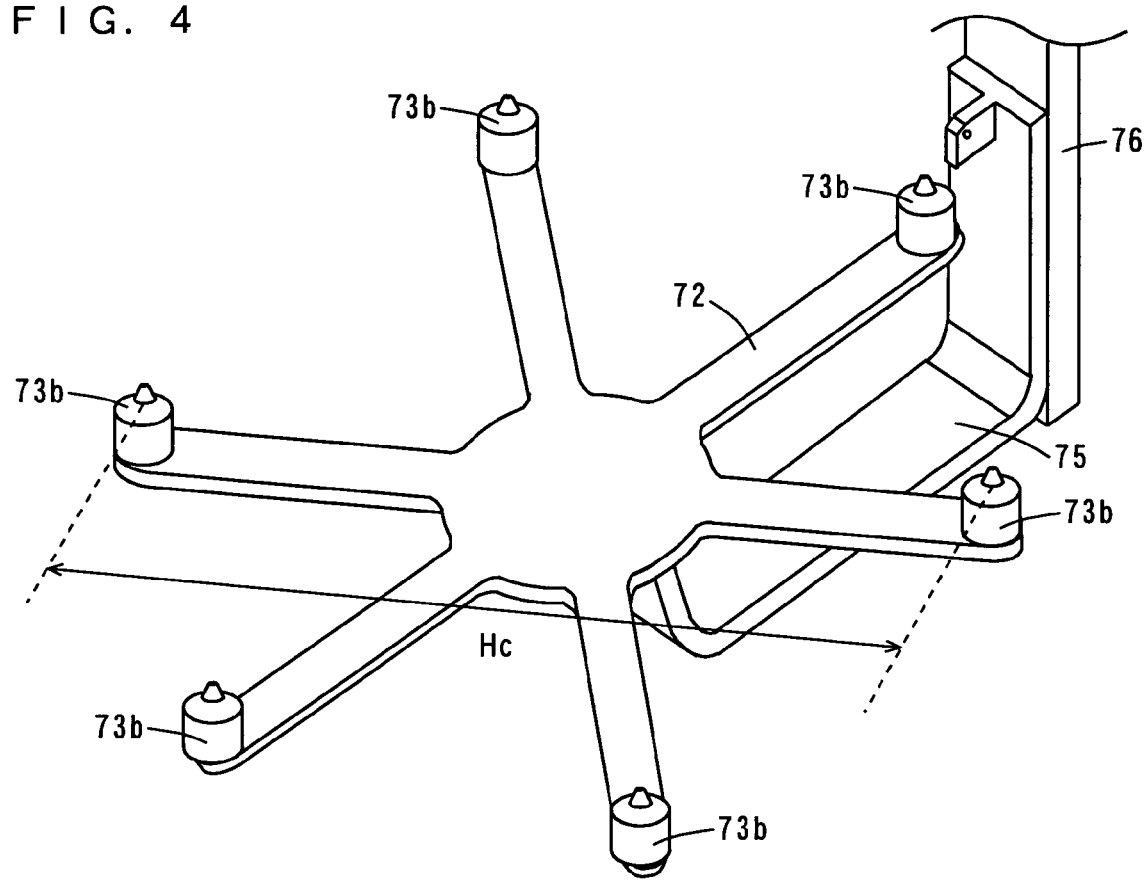
FIG. 4 is a perspective view showing the partial appearance of the substrate reversing device.

FIG. 3 is a perspective view showing the appearance of the substrate reversing device 7. FIG. 4 is a perspective view showing partial appearance of the substrate reversing device 7.

As shown in FIG. 3 and FIG. 4, the substrate reversing device 7 includes a first supporting member 71, second supporting member 72, plurality of substrate supporting pins 73a, 73b, first movable member 74, second movable member 75, fixing plate 76, link mechanism 77, and rotating mechanism 78.

As shown in FIG. 4, the second supporting member 72 is composed of six bar-shaped members that extend radially. The end portion of each of the six bar-shaped members is mounted with a substrate supporting pin 73b.

Similarly, as shown in FIG. 3, the first supporting member 71 is composed of six bar-shaped members that extend radially. The end portion of each of the six bar-shaped members is mounted with a substrate supporting pin 73a.

In this embodiment, the first supporting member 71 and second supporting member 72 are each composed of the six bar-shaped members; however, the first supporting member 71 and second supporting member 72 may each be composed of any number of bar-shaped members or other members having any other shape, including, e.g., a disk or triangular shape with a periphery corresponding to that of the plurality of first supporting pins 73a or second supporting pins 73b. The spacing Hc between substrate supporting pins 73b as well as the shape of each of a substrate supporting pin 73a and substrate supporting pin 73b shown in FIG. 4 will be described in detail below.

The first movable member 74 is U-shaped. The first supporting member 71 is secured to one end of the first movable member 74. The other end of the first movable member 74 is connected to the link mechanism 77. Similarly, the second movable member 75 is U-shaped. The second supporting member 72 is connected to one end of the second movable member 75. The other end of the second movable member 75 is connected to the link mechanism 77. The link mechanism 77 is mounted to the rotating shaft of the rotating mechanism 78. The link mechanism 77 and rotating mechanism 78 are mounted to the fixing plate 76.

The link mechanism 77 of FIG. 3 incorporates an air cylinder and the like. The link mechanism 77 is capable of selectively transferring the first movable member 74 and the second movable member 75 between a state in which they are spaced apart from each other and a state in which they are close to each other. The rotating mechanism 78 of FIG. 3 incorporates a motor and the like. The rotating mechanism 78 is capable of rotating the first movable member 74 and the second movable member 75, for example 180 degrees about the horizontal axis via the link mechanism 77.

Figure 5:
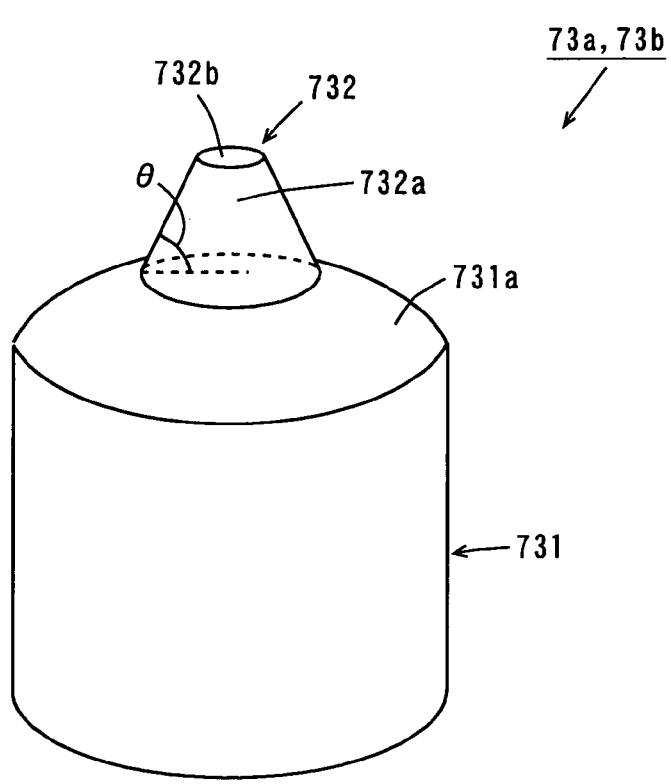
FIG. 5 is a perspective view for use in illustrating the detailed shaped of a substrate supporting pin.

Now turn to FIG. 5 that is a perspective view for illustrating the detailed shape of each of a substrate supporting pin 73a and substrate supporting pin 73b.

The substrate supporting pin 73a or substrate supporting pin 73b shown in FIG. 5 includes a mount portion 731 and a guide portion 732.

The mount portion 731 shown in FIG. 5 is formed in an approximate cylindrical shape. The mount portion 731 has a convex curved upper surface 731a. The guide portion 732 is arranged on the upper surface 731a of the mount portion 731. The guide portion 732 has a tapered inclined surface 732a that inclines upwardly toward the outside of a substrate W in supporting the substrate W. In this embodiment, the inclined surface 732a has a tapered angle θ (i.e., angle formed with respect to the horizontal surface) of 60 degrees, for example. The tip of the guide portion 732 is a flat surface 732b substantially parallel to a surface of the substrate W.

The mount portion 731 of each of the substrate supporting pins 73a, 73b has the convex curved surface 731a, so that the substrate supporting pins 73a, 73b can support the peripheral portion of the substrate W with a small area. Moreover, the inclined surface 732a having a tapered shape enables the substrate W to be directed onto the convex curved surface 731a of the mount portion 731 under its own weight, while preventing the substrate W from slippage with respect to the direction along the surface of the substrate W.

Figure 6:
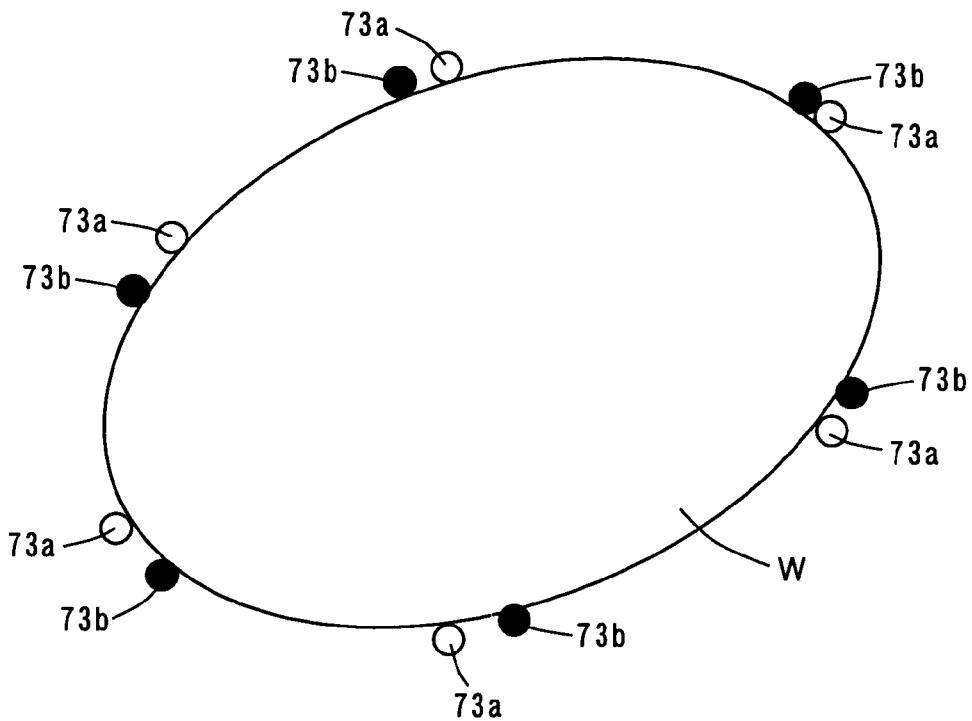
FIG. 6 is a schematic enlarged view showing a substrate being supported on the substrate supporting pins with the first movable member and second movable member close to each other.

Now turn to FIG. 6 that is a schematic enlarged view, showing the substrate W being supported on the substrate supporting pins 73a, 73b with the first movable member 74 and second movable member 75 close to each other.

In FIG. 6, the white circles represent the plurality of substrate supporting pins 73a mounted to the first supporting member 71, and the black circles represent the plurality of substrate supporting pins 73b mounted to the second supporting member 72.

As shown in FIG. 6, each of the substrate supporting pins 73a and each of the substrate supporting pins 73b support the substrate W in positions shifted away from each other along the direction of the periphery of the substrate W. This prevents interference between a substrate supporting pin 73a and substrate supporting pin 73b even when the first movable member 74 and second movable member 75 are brought close to each other.

In addition, the substrate supporting pins 73a and substrate supporting pins 73b, respectively, are substantially equally spaced along the outer edge of the substrate W. This ensures that the substrate W is supported safely by means of the plurality of substrate supporting pins 73a, 73b.

Moreover, the arrangement of the plurality of substrate supporting pins 73a and substrate supporting pins 73b that support the substrate W does not change when the substrate W is rotated 180 degrees. Consequently, when the substrate W is carried into and out of the substrate reversing device 7, the hand of the substrate transporting robot CR can be easily inserted into and out of the substrate reversing device 7 so as to avoid the plurality of substrate supporting pins 73a, 73b.

Figure 7:
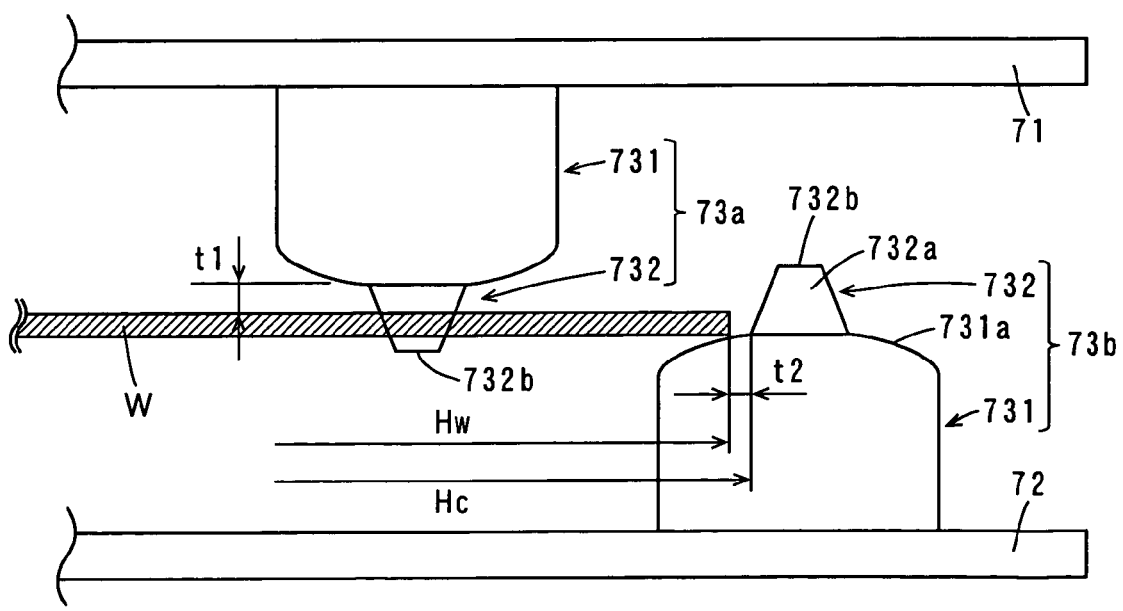
FIG. 7 is a schematic enlarged view showing the relationship between the plurality of substrate supporting pins and the substrate.

Now turn to FIG. 7 that is a schematic enlarged view showing the relationship between the plurality of substrate supporting pins 73a, 73b and the substrate W.

As shown in FIG. 7, when the first movable member 74 and second movable member 75 are close to each other, the peripheral portion of the substrate W is supported on the convex curved surface 731a formed on the mount portion 731 of each substrate supporting pin 73b in the second supporting member 72. In this case, as shown in FIG. 7, the tip portion 732b of the guide portion 732 in the substrate supporting pin 73a is positioned below the tip portion 732a of the guide portion 732 in the substrate supporting pin 73b. The substrate W is then positioned in a space sandwiched between a plane including the tip portion 732b of the substrate supporting pin 73a and parallel to the substrate W and a plane including the tip portion 732b of the substrate supporting pin 73b and parallel to the substrate W. In this manner, even when the substrate W is reversed 180 degrees, the substrate W is prevented from dropping from the first supporting member 71 and second supporting member 72.

As shown in FIG. 7, when the first movable member 74 and second movable member 75 are close to each other, the distance between the convex curved surface 731a on the mount portion 731 of the first supporting member 71 and the convex curved surface 731a on the mount portion 731 of the second supporting member 72 represents a sum of the thickness of the substrate W and a clearance t1. In this embodiment, the substrate W has a thickness of 0.7 mm to 0.8 mm, and the clearance t1 is approximately 2.0 mm. Note that the substrate W is transferred from the substrate supporting pin 73b onto the substrate supporting pin 73a under its own weight when rotated 180 degrees by the reversing mechanism 78, and therefore, the clearance t1 is determined such that the impact applied to the substrate W during this transfer may be small.

Note also that as shown in FIG. 7, a diameter Hc of a circle formed by the inner sides of the respective guide portions 732 of the plurality of substrate supporting pins 73*b* (see FIG. 4) is set greater than a diameter Hw of the substrate W by twice a clearance t2. In this embodiment, the diameter Hw of the substrate W is 300 nm; the above-mentioned diameter Hc of the circle is 301 mm; and the clearance t2 is 0.5 mm. That is, the diameter Hc has a total margin of 1.0 mm with respect to the diameter of the substrate W.

Figure 8:
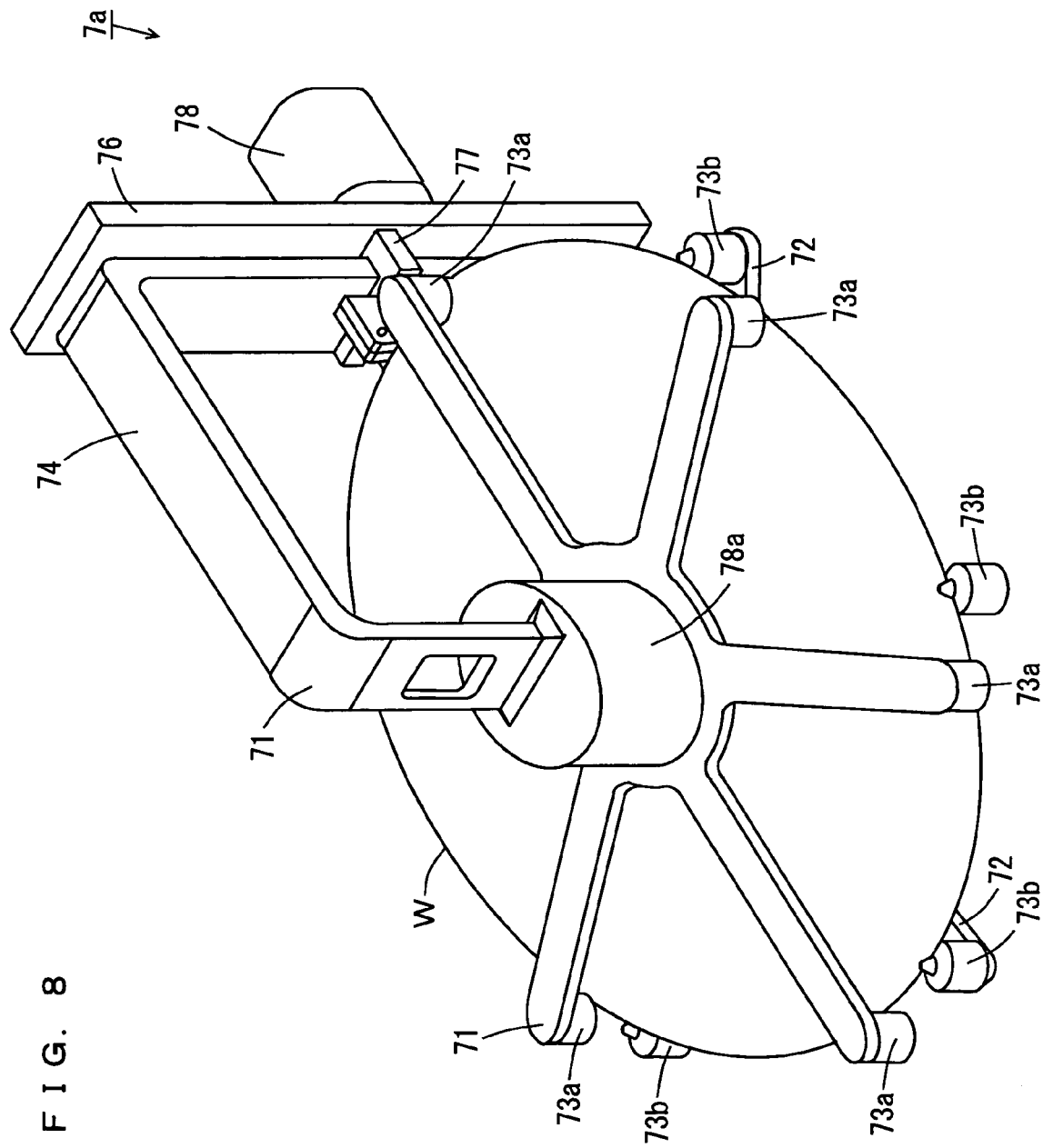
FIG. 8 is a perspective view showing another example of the substrate reversing device of FIG. 3.

Now turn to FIG. 8 that is a perspective view showing another example of the substrate reversing device 7 of FIG. 3.

The substrate reversing device 7*a* of FIG. 8 includes a horizontally rotating mechanism 78*a* in addition to the substrate reversing device 7 of FIG. 3.

The horizontally rotating mechanism 78*a* rotates a first supporting member 71 about an axis that is vertical to a substrate W and passes through an approximate center of the substrate W. In this case, a second supporting member 72 is also arranged to rotate about the axis that is vertical to the substrate W and passes through the approximate center of the substrate. With this structure, even a substrate W having a notch can be rotated such that the notch is in its optimum position, and then transferred to the hand of the substrate transporting robot CR.

Figure 9:
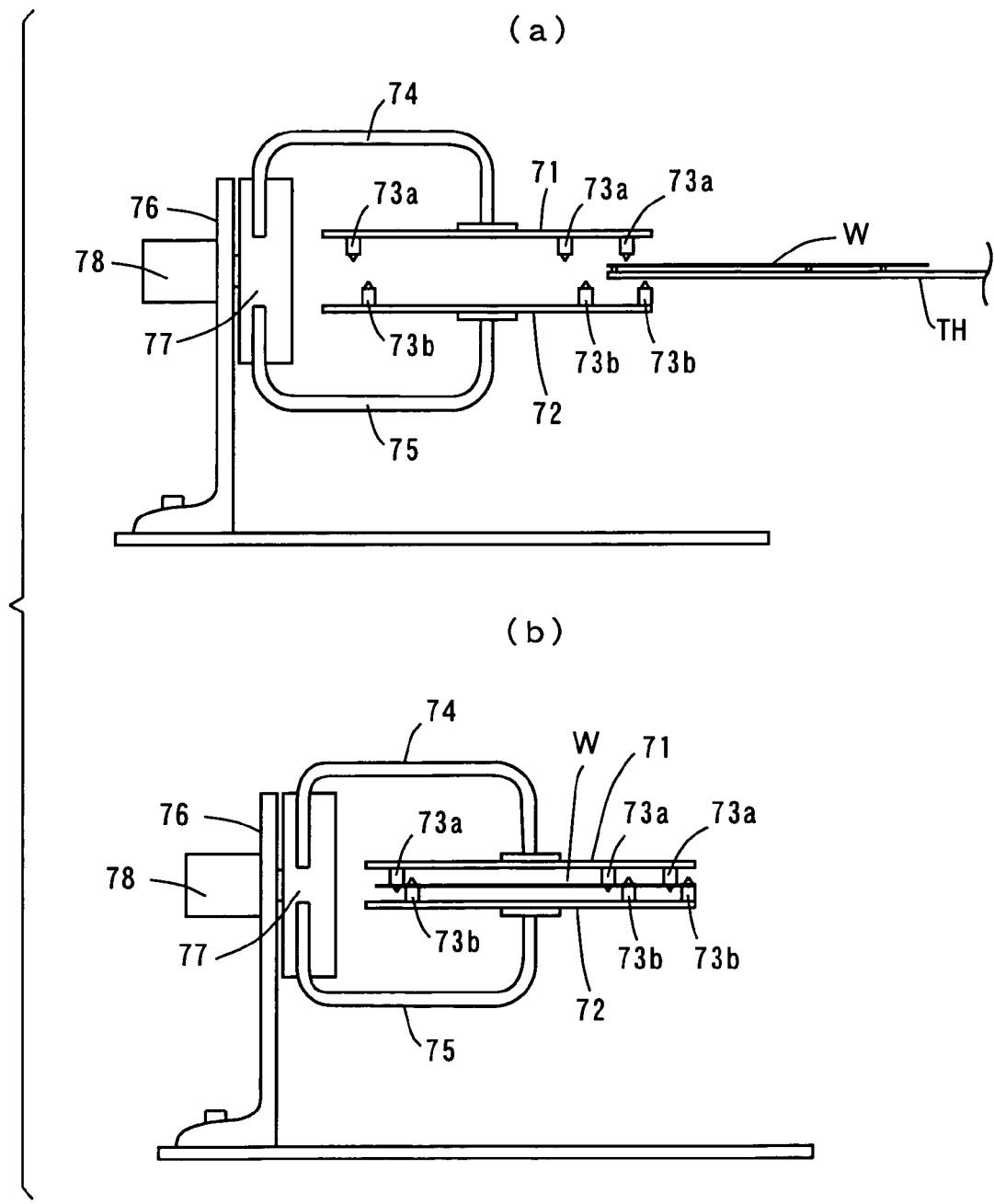
FIGS. 9(a) and 9(b) are schematic structural diagrams showing operations of the substrate reversing device according to the embodiment.

Now turn to FIG. 9 and FIG. 10 that are schematic structural diagrams each showing an operation of the substrate reversing device 7 according to this embodiment.

(1) Step of Placing a Substrate

First, as shown in FIG. 9(*a*), the hand TH of the substrate transporting robot CR of FIG. 1 carries a substrate W into the substrate reversing device 7. In this case, the link mechanism 77 operates to maintain the first movable member 74 and the second movable member 75 vertically apart. The hand TH transfers the substrate W onto the plurality of substrate supporting pins 73*b* of the second supporting member 72. In this case, the substrate W is transferred under its own weight along the tapered inclined surfaces 732*a* of the respective guide portions 732 of the plurality of supporting pins 73*b* mounted to the second supporting member 72 onto the mount portions 731, where the peripheral portion of the substrate W is supported. After transferring the substrate W, the hand TH of the substrate transporting robot CR withdraws from the substrate reversing device 7.

(2) Step of Bringing the Movable Members Close

Next, as shown in FIG. 9(*b*), the link mechanism 77 operates to transfer the first movable member 74 and second movable member 75 to a state in which they are vertically close. In this case, both the first movable member 74 and second movable member 75 move substantially an equal amount.

(3) Step of Reversing the Substrate

After this, as shown in FIG. 10(*c*), the rotating mechanism 78 operates to rotate 180 degrees the first movable member 74 and second movable member 75 about the horizontal axis in the direction of an arrow θ7.

In this case, the substrate W is rotated 180 degrees along with the first movable member 74 and second movable member 75, while being supported on the plurality of substrate supporting pins 73*a*, 73*b* mounted to the first supporting member 71 and second supporting member 72. In addition, as described above, the respective guide portions 732 of the plurality of substrate supporting pins 73*a* and the plurality of substrate supporting pins 73*b* partially overlap, so that when the substrate W is in a vertical position, the substrate is restricted from moving in the direction parallel to a surface of the substrate W (in this state perpendicular direction) by either of the guide portions 732. This prevents the substrate W from dropping.

(4) Step of Bringing the Movable Members Apart

Finally, the link mechanism 77 operates to transfer the first movable member 74 and second movable member 75 to a state in which they are vertically apart. In this case, both the first movable member 74 and second movable member 75 move substantially an equal amount. Meanwhile, the substrate W is supported on the supporting portions 731 of the plurality of substrate supporting pins 73*a*.

Then, the hand TH of the substrate transporting robot CR enters the substrate reversing device 7, and takes back the substrate W to withdraw from the substrate reversing device 7, as shown in FIG. 10(*d*).

As described above, the process of reversing the substrate W by the substrate reversing device 7 according to this embodiment completes in four steps, which is half the steps (eight) of the process performed by the conventional substrate reversing device 900. This enables the process of reversing a substrate to be performed in a short time. The substrate reversing device 7 does not require a withdrawal space such as that necessary for the conventional substrate supporting member 950 to move upward and downward, so that the size of the substrate reversing device 7 can be reduced. Moreover, in the substrate reversing device 7, the number of drive systems can be decreased to two, i.e., the link mechanism 77 and rotating mechanism 78, as compared to the conventional three, thus resulting in a smaller parts count and smaller number of exchanges of consumable items. Consequently, the cost can be reduced.

As a result, the substrate reversing device 7 according to this embodiment is capable of reversing a substrate reliably with a small number of steps and simple structure while enabling a smaller size.

In this embodiment, the substrate supporting pins 73*a* correspond to a plurality of first supporters; the substrate supporting pins 73*b* correspond to a plurality of second supporters; the first movable member 74 and the second movable member 75 being spaced apart from each other corresponds to a first state; the first movable member 74 and the second movable member 75 being close to each other corresponds to a second state; the link mechanism 77 corresponds to a driving device; the rotating mechanism 78 corresponds to a reversing device; the convex curved surface 731*a* corresponds to a supporting surface; and the inclined surface 732*a* corresponds to a restricting surface.

In this embodiment, when bringing the first movable member 74 and the second movable member 75 close to and apart from each other, both the first movable member 74 and second movable member 75 are moved substantially an equal amount. However, each of the first movable member 74 and the second movable member 75 may alternatively be moved a different amount, or only one of the first movable member 74 and second movable member 75 may be moved. Moreover, although the embodiment describes the case in which the substrate reversing device 7 is mounted in the substrate processing device 100, the substrate reversing device 7 may alternatively be mounted in another place, including any of the cleaning units 5*a* to 5*d* and the substrate transporting robot CR.

As an example, FIG. 11 is a schematic cross section showing a second embodiment in which the structure of the substrate reversing device 7 is applied to a processing unit. The entire structure of a substrate processing device according to the second embodiment is, for example, similar to that of the first embodiment except including four processing units 5e instead of the processing units 5a, 5b, 5c, 5d and omitting the substrate reversing device 7.

As shown in FIG. 11, the processing unit 5e includes a first supporting member 571 and a plurality of substrate supporting pins 573a for horizontally supporting a substrate W, and also a second supporting member 572 and a plurality of substrate supporting pins 573b above the first supporter 571. Note that the first supporting member 571 and the second supporting member 572 as well as the plurality of substrate supporting pins 573a and substrate supporting pins 573b have similar structures as those in the above-described embodiment which are illustrated from FIG. 3 throughout FIG. 10. A motor 501a is arranged below the first supporting member 571 for rotating the substrate W about a vertical rotating axis that passes through the center of the substrate W. Similarly, a motor 501b is arranged above the second supporting member 572 for rotating the substrate W about a vertical rotating axis that passes through the center of the substrate W. The motors 501a, 501b are controlled by a motor rotating mechanism 508a. The substrate W may be rotated while being horizontally supported, during the cleaning process of the substrate W using a chemical solution or water or drying process after the cleaning process.

The motor 501a is connected with one end of a first movable member 574, of which the other end is connected to a link mechanism 577. Similarly, the motor 501b is connected with one end of a second movable member 575, of which the other end is connected to the link mechanism 577.

The link mechanism 577 is capable of transferring the first movable member 574 and the second movable member 575 between a state in which they are vertically spaced apart and a state in which they are close to each other. The link mechanism 577 is also connected with a rotating mechanism 578. The rotating mechanism 578 is capable of rotating the link mechanism 577, first and second movable members 574, 575 as well as the first and second supporting members 571, 572 altogether.

The first supporter 571 is housed in a processing cup 502. A cylindrical partition wall 509 is arranged inside the processing cup 502. Between the processing cup 502 and the partition wall 509, a solution recovery space 506 is formed for recovering the chemical solution used in processing the substrate W. The solution recovery space 506 is connected to a recovery pipe 507 for recycling an excess of the chemical solution.

A motor 511 is arranged external to the processing cup 502. The motor 511 is connected with a rotating shaft 512. The rotating shaft 512 is coupled to an arm 513 extending in the horizontal direction, of which end is mounted with a nozzle 510.

Next, the arm 513 swings to cause the nozzle 510 to move above the substrate W, and the nozzle 510 discharges the chemical solution or water onto the substrate W being rotated by the motor 501b. The surface of the substrate W is thus cleaned. Then, when cleaning the back surface of the substrate W, the link mechanism 577 brings the first and the second movable members 574, 575 close to each other.

After this, the first and the second movable members 574, 575 are rotated 180 degrees by the rotating mechanism 578. This causes the substrate W to be rotated 180 degrees. The link mechanism 577 moves the first and the second movable members 574, 575 vertically apart from each other. Then, the arm 513 swings to cause the nozzle 510 to move above the substrate W, and the nozzle 510 discharges the chemical solution or water onto the substrate W being rotated by the motor 501b. The back surface of the substrate W is thus cleaned.

As described above, the application of the structure of the substrate reversing device 7 to the processing unit enables the step of supporting the substrate W and the step of reversing the substrate W to be performed by means of the first and the second movable members 574, 575. Consequently, the substrate W can be easily reversed, and the process of reversing the substrate W can be performed in a short time.

Moreover, the substrate W is supported and reversed by the first and the second movable members 574, 575, so that a withdrawal space is unnecessary. As a result, the processing unit employing the structure of the substrate reversing device 7 according to this embodiment is capable of reversing a substrate reliably with a small number of steps and simple structure while enabling a smaller size.

Figure 12:
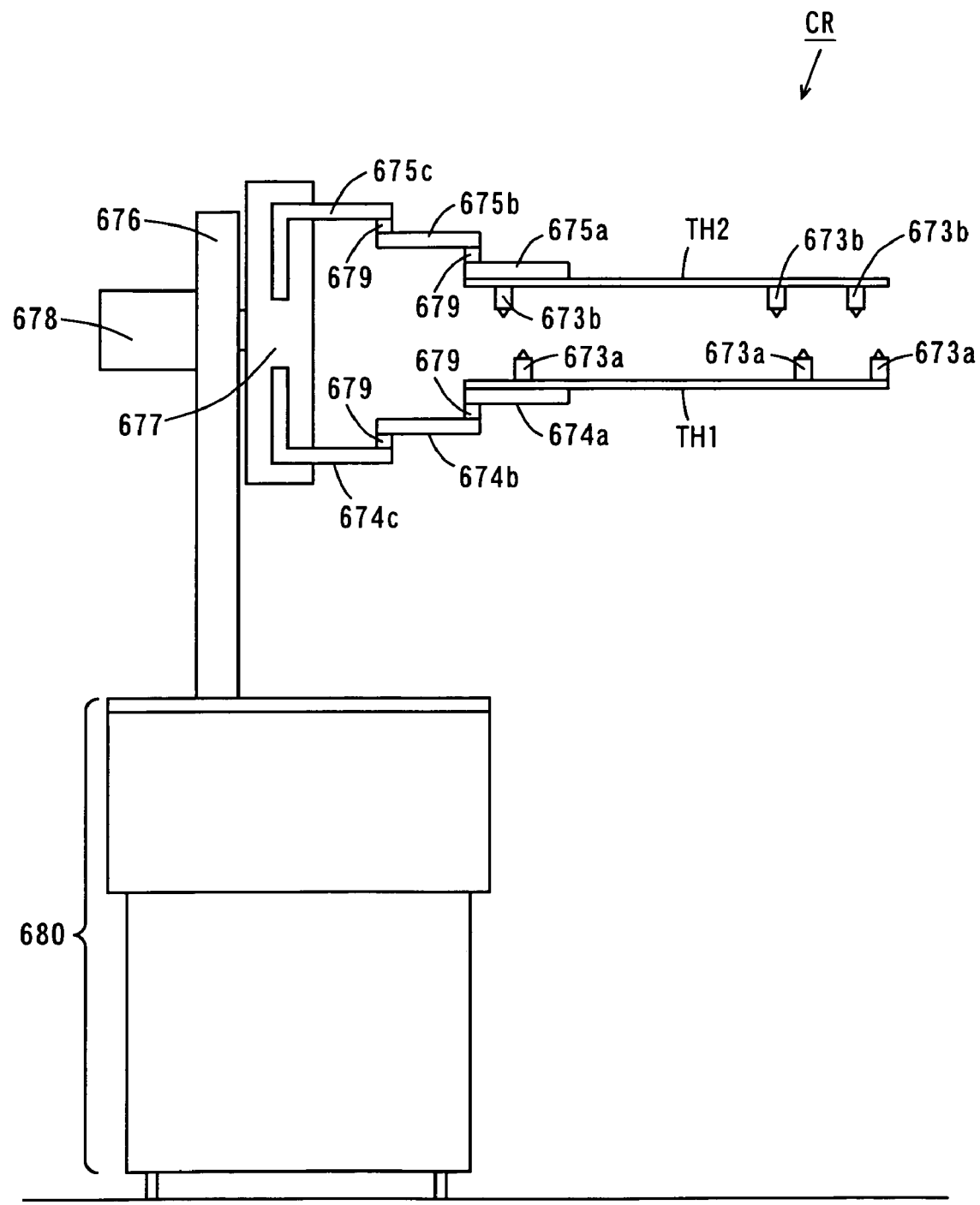
FIG. 12 is a diagram showing a third embodiment in which the substrate reversing device is mounted in the substrate transporting robot.
Figure 13:
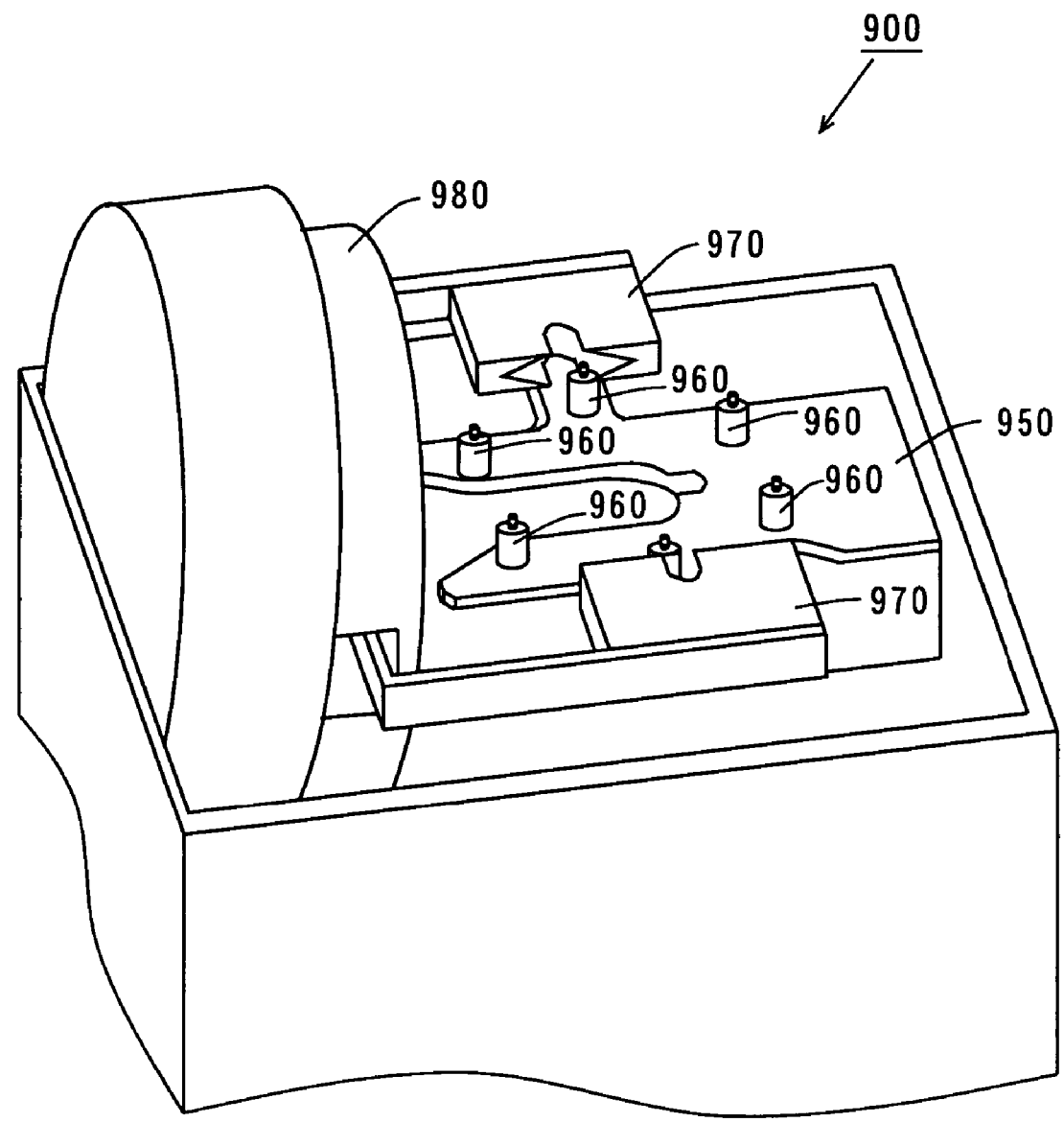
FIG. 13 is a schematic diagram showing the structure of a conventional substrate reversing device.
Figure 14:
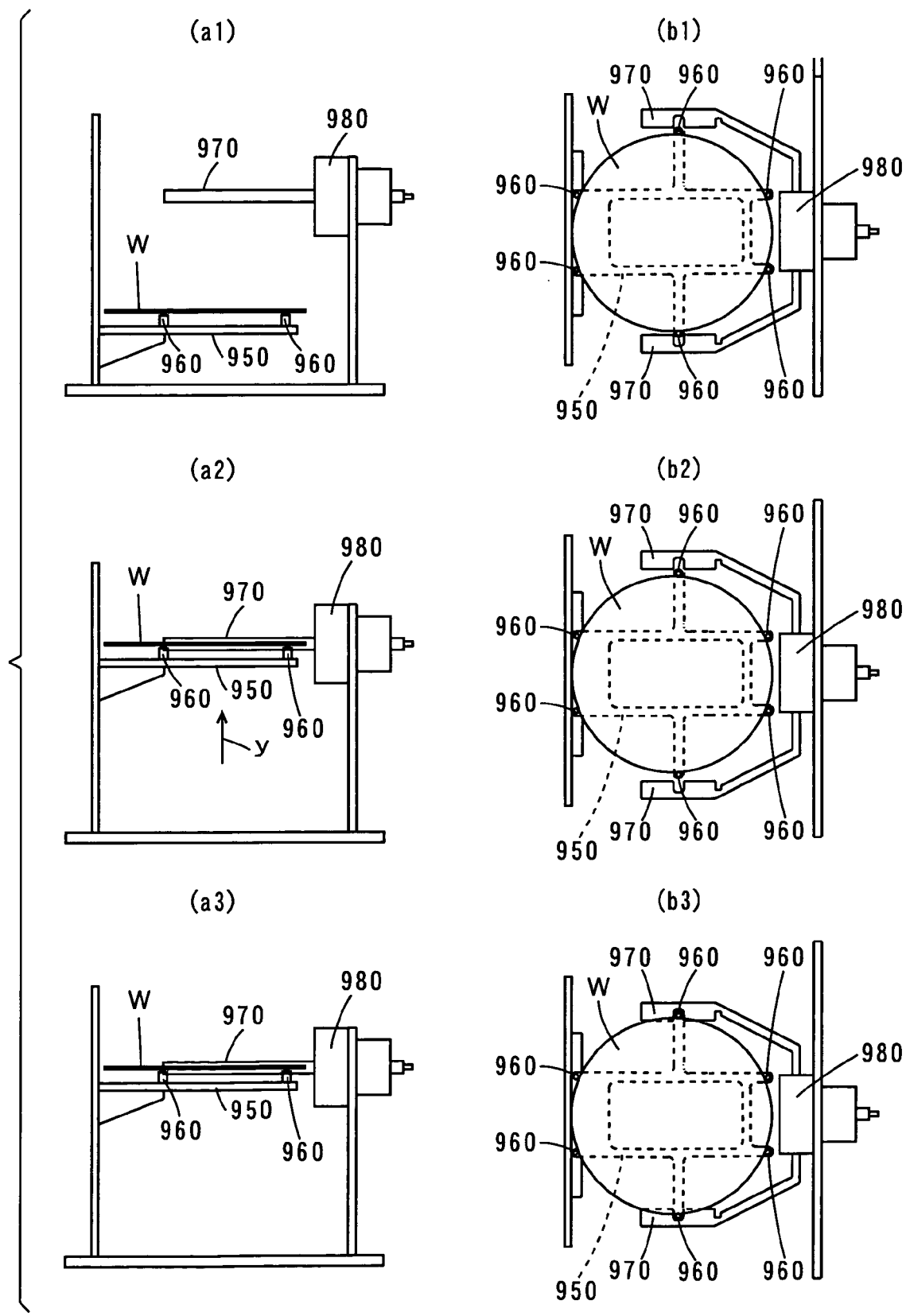
FIGS. 14(a1), 14(a2), 14(a3) as well as 14(b1), 14(b2), 14(b3) are schematic diagrams showing operations of the conventional substrate reversing device.
Figure 15:
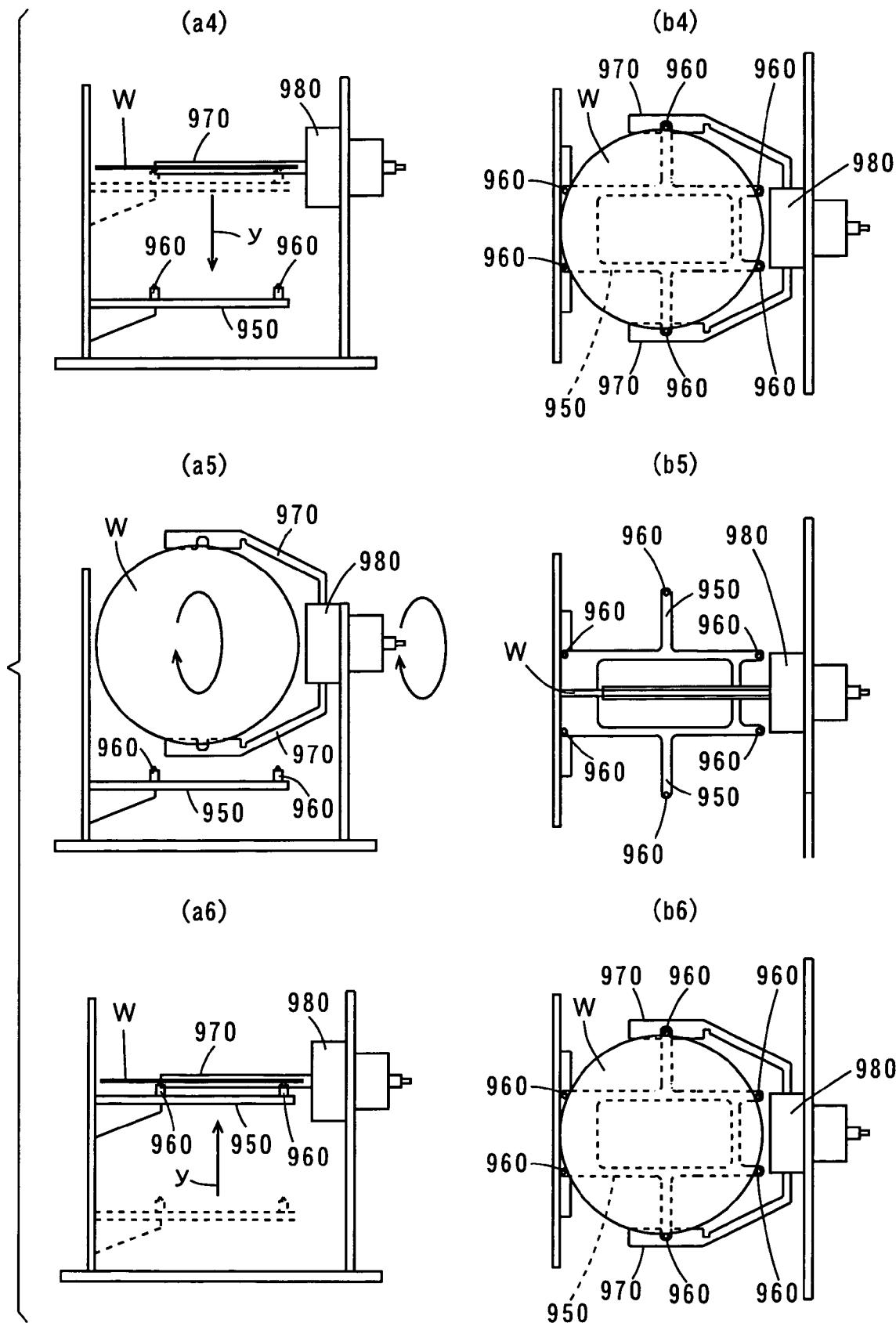
FIGS. 15(a4), 15(a5), 15(a6) as well as 15(b4), (b5), (b6) are schematic diagrams showing operations of the conventional substrate reversing device.
Figure 16:
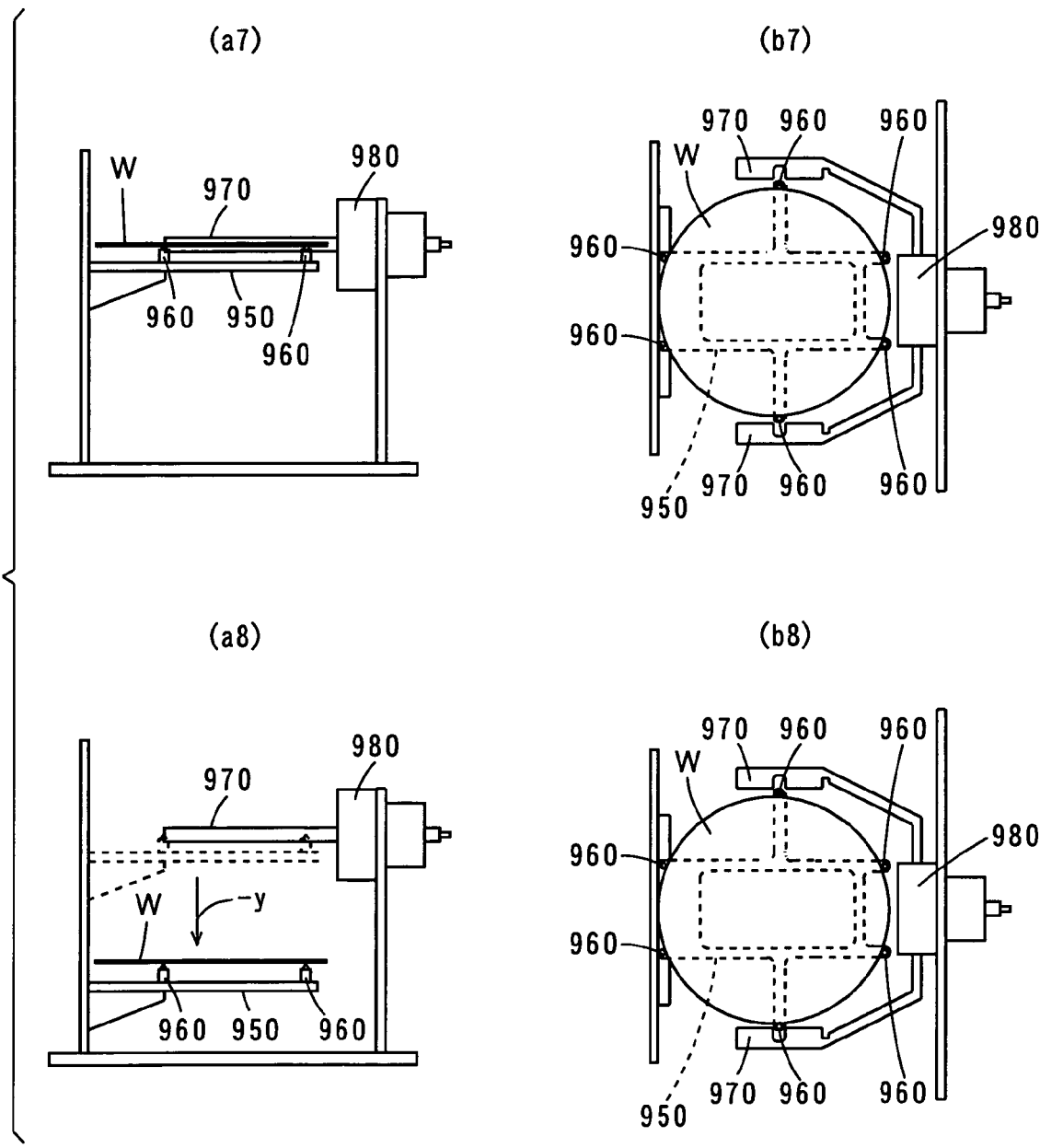
FIGS. 16(a7), 16(a8) as well as 16(b7), 16(b8) are schematic diagrams showing operations of the conventional substrate reversing device.

Similarly, FIG. 12 is a diagram showing a third embodiment in which the structure of the substrate reversing device 7 is applied to a substrate transporting robot CR. The entire structure of a substrate processing device according to the third embodiment is, for example, similar to that of the first embodiment except substituting the substrate transporting robot CR of FIG. 1 with the substrate transporting robot CR of FIG. 12, and omitting the substrate reversing device 7.

As shown in FIG. 12, the substrate transporting robot CR comprises a body portion 680; first movable members 674a, 674b, 674c; second movable members 675a, 675b, 675c; hands TH1, TH2; fixing plate 676; link mechanism 677; rotating mechanism 678; and a plurality of rotating shafts 679. The hands TH1, TH2 are mounted with a plurality of substrate supporting pins 673a and a plurality of substrate supporting pins 673b, respectively. Note that the structures of the hands TH1, TH2 (corresponding to the first and the second supporting members) and the structures of the plurality of substrate supporting pins 673a and substrate supporting pins 673b are similar to those in the above-described embodiment which are illustrated from FIG. 3 throughout FIG. 10.

The hand TH1 is mounted to the first movable member 674a. The first movable member 674a is connected to the first movable member 674b via the rotating shaft 679. The first movable member 674b is connected to the first movable member 674c via the rotating shaft 679. The first movable member 674c is mounted to the link mechanism 677.

Similarly, the hand TH2 is mounted to the second movable member 675a. The second movable member 675a is connected to the second movable member 675b, via the rotating shaft 679. The second movable member 675b, is connected to the second movable member 675c via the rotating shaft 679. The second movable member 675c is mounted to the link mechanism 677.

Each of the rotating shafts 679 is arranged to rotate about an axis vertical to a plane including the substrate W supported by the hands TH1, TH2. This enables the hand TH1 and hand TH2 to move parallel to the horizontal plane (hereinafter referred to as "extend or contract").

The link mechanism 677 is capable of transferring the first movable members 674a to 674c and the second movable members 675a to 675c between a state in which they are spaced apart from one another and a state in which they are close to one another, in the vertical direction to the plane including the substrate W supported by the hands TH1, TH2, The rotating mechanism 678 is capable of rotating 180 degrees the link mechanism 677, first movable members 674a to 674c, second movable members 675a to 675c, and hands TH1, TH2.

In the substrate transporting robot CR shown in FIG. 12, the first movable members 674a to 674c cause the hand TH1 to extend or contract, allowing the substrate transporting robot CR to transfer or receive a substrate W to or from the indexer robot IR or each of the processing units 5a to 5e.

In reversing the substrate W 180 degrees, with the hand TH1 and hand TH2 opposing each other, the link mechanism 677 brings vertically close the first movable members 674a to 674c and the second movable members 675a to 675c.

Then, the first movable members 674a to 674c and the second movable members 675a to 675c are rotated 180 degrees by means of the rotating mechanism 678 such that the substrate W is rotated 180 degrees. In this manner, the substrate W is transferred from the hand TH1 to the hand TH2.

After this, the first movable members 674a to 674c and the second movable members 675a to 675c are moved vertically apart. Then, the second movable members 675a to 675c cause the hand TH2 to extend or contract, allowing the substrate transporting robot CR to transfer or receive the substrate W from or to the indexer robot IR or each of the processing units.

As described above, the application of the structure of the substrate reversing device 7 to the substrate transporting robot CR enables the step of supporting the substrate W and the step of reversing the substrate W to be performed by means of the first movable members 674a to 674c and the second movable members 675a to 675c. Consequently, the substrate W can be easily reversed, and the process of reversing the substrate W can be performed in a short time. As a result, the substrate transporting robot employing the structure of the substrate reversing device 7 according to this embodiment is capable of reversing a substrate reliably with a small number of steps and simple structure while enabling a smaller size. In particular, since the substrate transporting robot CR itself has the function of reversing a substrate W, reversing a substrate W during the transport of the substrate W can further reduce the time required for the whole processing of the substrate W.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate reversing device that reverses a substrate which has first and second substantially circular surfaces opposite to each other and a circumference, and each said surface having a respective peripheral portion, comprising:
   first and second movable members arranged opposite to each other for receiving said substrate such that the first and second surfaces are opposite to said first and second movable members respectively;
   a plurality of first supporters that are provided on said first movable member and support the first peripheral portion of the substrate;
   a plurality of second supporters that are provided on said second movable member and support the second peripheral portion of the substrate;
   a driving device that moves at least one of said first and said second movable members relative to the other such that said plurality of first supporters and said plurality of second supporters are selectively transferred between a first state in which said plurality of first supporters and said plurality of second supporters are spaced apart from one another and a second state in which said plurality of first supporters and said plurality of second supporters are closer to one another; and
   a reversing device that reverses said first and second movable members in said second state about an axis parallel to the first and second surfaces;
   wherein corresponding pairs of said first supporters and said second supporters are arranged in positions shifted away from each other in a direction along the circumference of the substrate.

2. The substrate reversing device according to claim 1, wherein
   said first movable member is composed of a plurality of first bar-shaped members that extend radially, each of said first supporters being provided on an end portion of one of said plurality of first bar-shaped members, and
   said second movable member is composed of a plurality of second bar-shaped members that extend radially, each of said second supporters being provided on an end portion of one of said plurality of second bar-shaped members.

3. The substrate reversing device according to claim 1, wherein
   each of said first supporters and second supporters has a supporting surface that supports the corresponding peripheral portion of the substrate and a restricting surface that prevents the substrate from slipping in a direction along a surface of the substrate.

4. The substrate reversing device according to claim 3, wherein
   said supporting surface is a convex surface, and
   said restricting surface is an inclined surface that inclines away from the center of the substrate with increasing distance from a plane defined by the substrate supported on said supporting surface.

5. The substrate reversing device according to claim 1, wherein
   said reversing device rotates 180 degrees said first and said second movable members.

6. The substrate reversing device according to claim 1, wherein
   said driving device moves both of said first and said second movable members such that said first and said second movable members are transferred between said first state and said second state.

7. The substrate reversing device according to claim 1, wherein
   said first and said second movable members are moved substantially an equal amount by said driving device.

8. The substrate reversing device according to claim 1, further comprising a controller that controls said driving device such that in said second state, said plurality of first supporters and said plurality of second supporters partially overlap with each other in a direction vertical to the substrate.

9. A substrate transporting device that transports a substrate which has first and second substantially circular surfaces opposite to each other and a circumference, and each said surface having a respective peripheral portion, comprising:
   a substrate reversing device; and
   a moving device that moves said substrate reversing device, wherein said substrate reversing device includes:

first and second movable members arranged opposite to each other for receiving said substrate such that the first and second surfaces are opposite to said first and second movable members respectively;

a plurality of first supporters that are provided on said first movable member and support the first peripheral portion of the substrate;

a plurality of second supporters that are provided on said second movable member and support the second peripheral portion of the substrate;

a driving device that moves at least one of said first and said second movable members relative to the other such that said plurality of first supporters and said plurality of second supporters are selectively transferred between a first state in which said plurality of first supporters and said plurality of second supporters are spaced apart from one another and a second state in which said plurality of first supporters and said plurality of second supporters are closer to one another; and a reversing device that reverses said first and second movable members in said second state about an axis parallel to the first and second surfaces;

wherein corresponding pairs of said first supporters and said second supporters are arranged in positions shifted away from each other in a direction along the circumference of the substrate.

10. A substrate processing device that performs processing of a substrate which has first and second substantially circular surfaces opposite to each other and a circumference, and each said surface having a respective peripheral portion, comprising:

a substrate reversing device that reverses the substrate about an axis parallel to the first and second surfaces while supporting the substrate; and a processing device that performs processing of the substrate being supported by said substrate reversing device, wherein said substrate reversing device includes:

first and second movable members arranged opposite to each other for receiving said substrate such that the first and second surfaces are opposite to said first and second movable members respectively;

a plurality of first supporters that are provided on said first movable member and support the first peripheral portion of the substrate;

a plurality of second supporters that are provided on said second movable member and support the second peripheral portion of the substrate;

a driving device that moves at least one of said first and said second movable members relative to the other such that said plurality of first supporters and said plurality of second supporters are selectively transferred between a first state in which said plurality of first supporters and said plurality of second supporters are spaced apart from one another and a second state in which said plurality of first supporters and said plurality of second supporters are closer to one another; and a reversing device that reverses said first and second movable members in said second state about an axis parallel to the first and second surfaces;

wherein corresponding pairs of said first supporters and said second supporters are arranged in positions shifted away from each other in a direction along the circumference of the substrate.

11. The substrate processing device according to claim 10, wherein said processing device includes first and second processing units that perform processing of the substrate, and said substrate reversing device reverses the substrate subjected to processing by said first processing unit, and wherein said second processing unit performs processing of the substrate reversed by said substrate reversing device.

12. A method of reversing a substrate which has first and second substantially circular surfaces opposite to each other and a circumference, and each said surface having a respective peripheral portion, comprising the steps of:

arranging the substrate between first and second movable members such that the first and second surfaces of the substrate are opposite to said first and second movable members respectively;

supporting the first peripheral portion of the substrate on a plurality of first supporters provided on said first movable member;

subsequent to said step of supporting the first peripheral portion of the substrate on said plurality of first supporters, moving at least one of said first and second movable members relative to the other such that a plurality of second supporters provided on said second movable member are brought closer to said plurality of first supporters;

arranging corresponding pairs of said first supporters and said second supporters in positions shifted away from each other in a direction along the circumference of the substrate;

subsequent to said step of moving, reversing said first and second movable members about an axis parallel to the first and second surfaces while supporting the second peripheral portion of the substrate on said plurality of second supporters; and subsequent to said step of supporting the second peripheral portion of the substrate on said plurality of second supporters, moving at least one of said first and second movable members relative to the other such that said plurality of first supporters and said plurality of second supporters are spaced apart from one another.

13. A transporting method for transporting a substrate which has first and second substantially circular surfaces opposite to each other and a circumference, and each said surface having a respective peripheral portion, comprising the steps of:

reversing the substrate about an axis parallel to the first and second surfaces while supporting the substrate using a substrate reversing device; and moving said substrate reversing device supporting the substrate, wherein said step of reversing the substrate while supporting the substrate comprises the steps of:

arranging the substrate between first and second movable members such that the first and second surfaces of the substrate are opposite to said first and second movable members respectively;

supporting the first peripheral portion of the substrate on a plurality of first supporters provided on said first movable member in said substrate reversing device;

subsequent to said step of supporting the first peripheral portion of the substrate on said plurality of first supporters, moving at least one of said first and second movable members relative to the other such that a plurality of second supporters provided on said second movable member are brought closer to said plurality of first supporters in said substrate reversing device;

arranging corresponding pairs of said first supporters and said second supporters in positions shifted away from each other in a direction along the circumference of the substrate;

subsequent to said step of moving, reversing said first and second movable members about an axis parallel to the first and second surfaces while supporting the second peripheral portion of the substrate on said plurality of second supporters; and subsequent to said step of supporting the second peripheral portion of the substrate on said plurality of second supporters, moving at least one of said first and second movable members relative to the other such that said plurality of first supporters and said plurality of second supporters are spaced apart from one another.

14. A method of processing a substrate for performing processing of the substrate which has first and second substantially circular surfaces opposite to each other and a circumference, and each said surface having a respective peripheral portion, comprising the steps of:

reversing the substrate about an axis parallel to the first and second surfaces while supporting the substrate using a substrate reversing device; and performing processing of the substrate being supported by said substrate reversing device, wherein said step of reversing the substrate while supporting the substrate comprises the steps of:

arranging the substrate between first and second movable members such that the first and second surfaces of the substrate are opposite to said first and second movable members respectively;

supporting the first peripheral portion of the substrate on a plurality of first supporters provided to a first movable member in said substrate reversing device;

subsequent to said step of supporting the first peripheral portion of the substrate on said plurality of first supporters, moving at least one of said first and second movable members relative to the other such that a plurality of second supporters provided on said second movable member are brought closer to said plurality of first supporters in said substrate reversing device;

arranging corresponding pairs of said first supporters and said second supporters in positions shifted away from each other in a direction along the circumference of the substrate;

subsequent to said step of moving, reversing said first and second movable members about an axis parallel to the first and second surfaces while supporting the second peripheral portion of the substrate on said plurality of second supporters; and subsequent to said step of supporting the second peripheral portion of the substrate on said plurality of second supporters, moving at least one of said first and second movable members relative to the other such that said plurality of first supporters and said plurality of second supporters are spaced apart from one another.

15. The method of processing a substrate according to claim 14, wherein said step of performing processing of the substrate includes the step of performing first processing of the substrate and the step of performing second processing of the substrate, and said step of reversing the substrate while supporting the substrate includes the step of reversing the substrate that has been subjected to said first processing, using said substrate reversing device, and wherein said step of performing second processing includes the step of performing said second processing of said reversed substrate.

* * * * *